US011357109B2

(12) United States Patent
An et al.

(10) Patent No.: US 11,357,109 B2
(45) Date of Patent: Jun. 7, 2022

(54) FOLDABLE ELECTRONIC DEVICE INCLUDING INTEGRATED GROUND STRUCTURE

(71) Applicant: SAMSUNG ELECTRONICS CO., LTD., Suwon-si (KR)

(72) Inventors: Jungchul An, Suwon-si (KR); Jaehwan Park, Suwon-si (KR); Changyong Seo, Suwon-si (KR); Seungki Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/507,907

(22) Filed: Oct. 22, 2021

(65) Prior Publication Data

US 2022/0046796 A1 Feb. 10, 2022

Related U.S. Application Data

(63) Continuation of application No. 16/783,463, filed on Feb. 6, 2020, now Pat. No. 11,184,980.

(30) Foreign Application Priority Data

Feb. 19, 2019 (KR) .......................... 10-2019-0019344

(51) Int. Cl.
*H05K 1/00* (2006.01)
*H05K 1/02* (2006.01)
(Continued)

(52) U.S. Cl.
CPC ............. *H05K 1/147* (2013.01); *H05K 1/189* (2013.01); *H05K 5/0004* (2013.01);
(Continued)

(58) Field of Classification Search
CPC ... H05K 1/00; H05K 1/02; H05K 1/11; H05K 1/14; H05K 1/18; H05K 1/147;
(Continued)

(56) References Cited

U.S. PATENT DOCUMENTS 6,262,785 B1 * 7/2001 Kim ...................... G06F 1/1616
349/58
9,348,450 B1 * 5/2016 Kim ...................... G06F 1/1681
(Continued)

FOREIGN PATENT DOCUMENTS

| CN | 1582106 A | 2/2005 |
|---|---|---|
| CN | 105549682 A | 5/2016 |

(Continued)

OTHER PUBLICATIONS

U.S. Appl. No. 16/783,463, filed Feb. 6, 2020; An et al.
(Continued)

*Primary Examiner* — Xiaoliang Chen
(74) *Attorney, Agent, or Firm* — Nixon & Vanderhye P.C.

(57) ABSTRACT

An electronic device includes first and second housings rotatably coupled with each other through a hinge, thereby being in a folded state or an unfolded state. The electronic device further includes first and second printed circuit boards (PCBs) disposed in the first and second housings, respectively, and at least one wiring member electrically connecting the first and second PCBs. The electronic device further includes a window disposed over the first and second housings and the hinge, and a display disposed under the window. The display includes a display panel extending in the first housing and having a first FPCB electrically connected to a ground of the first PCB. The display includes a polymer member, a first conductive member disposed in the first housing and electrically connected to the first FPCB, and a second conductive member disposed in the second
(Continued)

housing. The electronic device further includes a supporting member disposed between the second conductive member and the second PCB in the second housing. The second conductive member is electrically connected to the second PCB through a conductive region of the supporting member and electrically connected to the ground of the first PCB through the wiring member.

7 Claims, 9 Drawing Sheets

(51) Int. Cl.
| | | |
|---|---|---|
| H05K 1/11 | (2006.01) | |
| H05K 1/14 | (2006.01) | |
| H05K 1/18 | (2006.01) | |
| H05K 5/00 | (2006.01) | |
| H05K 5/02 | (2006.01) | |
| H05K 5/04 | (2006.01) | |
| H05K 7/00 | (2006.01) | |
| H05K 13/00 | (2006.01) | |
| G06F 3/01 | (2006.01) | |
| G06F 3/14 | (2006.01) | |
| G06F 3/041 | (2006.01) | |
| G06F 3/044 | (2006.01) | |
| G06F 3/045 | (2006.01) | |
| G06F 3/048 | (2013.01) | |
| G06F 3/04842 | (2022.01) | |
| H04M 1/00 | (2006.01) | |
| H04M 1/02 | (2006.01) | |

(52) U.S. Cl.
CPC ......... *H05K 5/0017* (2013.01); *H05K 5/0226* (2013.01); *H05K 2201/056* (2013.01); *H05K 2201/10128* (2013.01)

(58) Field of Classification Search
CPC ............ H05K 1/189; H05K 5/00; H05K 5/02; H05K 5/0004; H05K 5/0017; H05K 5/0226; H05K 7/00; H05K 13/00; G06F 1/16; G06F 3/01; G06F 3/14; G06F 3/041; G06F 3/044; G06F 3/045; G06F 3/048; G06F 3/0412; G06F 3/04842; H04M 1/00; H04M 1/02
USPC ............ 361/749, 679.01, 679.27; 455/575.3, 455/575.4; 343/702, 846; 349/58
See application file for complete search history.

(56) References Cited

U.S. PATENT DOCUMENTS

| | | | | |
|---|---|---|---|---|
| 9,470,404 | B2* | 10/2016 | Lee | F21V 21/30 |
| 9,690,385 | B2* | 6/2017 | Becze | G06F 16/54 |
| 9,720,455 | B2* | 8/2017 | Jang | G06F 1/1641 |
| 9,766,737 | B2* | 9/2017 | Ahn | G06F 3/0447 |
| 9,952,622 | B2 | 4/2018 | Kim et al. | |
| 10,091,896 | B2* | 10/2018 | Chu | H05K 5/0226 |
| 10,394,282 | B2* | 8/2019 | Lee | G06F 1/1681 |
| 10,678,428 | B2* | 6/2020 | Kim | G06F 3/0487 |
| 10,686,028 | B2* | 6/2020 | Ahn | G02F 1/133305 |
| 10,727,435 | B2* | 7/2020 | Kim | G06F 1/1601 |
| 10,736,224 | B2* | 8/2020 | Park | E05D 5/14 |
| 10,754,377 | B2* | 8/2020 | Siddiqui | G06F 1/1618 |
| 10,775,852 | B2* | 9/2020 | Kim | H05K 5/0226 |
| 2002/0142736 | A1* | 10/2002 | Shin | H04M 1/0216 |
| | | | | 455/575.3 |
| 2002/0180651 | A1* | 12/2002 | Hareyama | H01Q 9/0442 |
| | | | | 343/702 |
| 2005/0030233 | A1 | 2/2005 | Kim et al. | |
| 2006/0050490 | A1 | 3/2006 | Ootani | |
| 2009/0221335 | A1* | 9/2009 | Nakazawa | H04M 1/0216 |
| | | | | 455/575.4 |
| 2010/0045541 | A1* | 2/2010 | Aoki | H01Q 9/30 |
| | | | | 343/702 |
| 2010/0156857 | A1 | 6/2010 | Nozaki | |
| 2010/0279747 | A1* | 11/2010 | Imano | H01Q 1/50 |
| | | | | 455/575.3 |
| 2011/0120770 | A1 | 5/2011 | Yokonuma | |
| 2011/0230146 | A1 | 9/2011 | Morishshita et al. | |
| 2012/0002369 | A1 | 1/2012 | Wang | |
| 2012/0229960 | A1* | 9/2012 | Pegg | H04M 1/0218 |
| | | | | 361/679.01 |
| 2013/0314611 | A1* | 11/2013 | Okutsu | H05K 5/0234 |
| | | | | 348/739 |
| 2014/0042293 | A1* | 2/2014 | Mok | G06F 1/1652 |
| | | | | 248/682 |
| 2014/0055920 | A1* | 2/2014 | Liang | H05K 5/0226 |
| | | | | 361/679.01 |
| 2014/0111954 | A1* | 4/2014 | Lee | G06F 1/1652 |
| | | | | 361/749 |
| 2014/0126121 | A1* | 5/2014 | Griffin | H04M 1/0216 |
| | | | | 361/679.01 |
| 2014/0187296 | A1* | 7/2014 | Sano | H04M 1/0216 |
| | | | | 455/575.3 |
| 2015/0085433 | A1* | 3/2015 | Kim | G06F 1/1698 |
| | | | | 361/679.01 |
| 2015/0241925 | A1* | 8/2015 | Seo | G06F 1/1681 |
| | | | | 361/679.27 |
| 2016/0116944 | A1 | 4/2016 | Lee et al. | |
| 2017/0142241 | A1 | 5/2017 | Kim et al. | |
| 2017/0171939 | A1 | 6/2017 | Yang et al. | |
| 2017/0364123 | A1* | 12/2017 | Seo | G06F 1/1652 |
| 2018/0077810 | A1* | 3/2018 | Moon | G06F 1/1618 |
| 2018/0324964 | A1 | 11/2018 | Yoo et al. | |
| 2018/0366813 | A1 | 12/2018 | Kim et al. | |
| 2019/0025887 | A1* | 1/2019 | Seo | G06F 1/1652 |
| 2019/0171315 | A1* | 6/2019 | Park | G06F 3/0445 |

FOREIGN PATENT DOCUMENTS

| | | |
|---|---|---|
| CN | 106711579 A | 5/2017 |
| CN | 107025851 A | 8/2017 |
| CN | 107390780 A | 11/2017 |
| CN | 108292796 A | 7/2018 |
| EP | 1 633 173 A1 | 3/2006 |
| KR | 10-2007-0048537 A | 5/2007 |
| KR | 10-0822186 | 4/2008 |
| KR | 10-1122091 | 2/2012 |
| KR | 10-2017-0066944 | 6/2017 |
| KR | 10-2017-0136258 | 12/2017 |
| RU | 2472233 C2 | 1/2013 |
| RU | 147380 U1 | 11/2014 |

OTHER PUBLICATIONS

International Search Report and Written Opinion dated May 20, 2020 in counterpart International Patent Application No. PCT/KR2020/001663.
Chinese Office Action dated Nov. 29, 2021 for CN Application No. 202080014821,4.
Russian Notice of Allowance dated Jan. 28, 2022 for RU Application No. 2021124432.
European Extended Search Report dated Feb. 22, 2022 for EP Application No. 20759816,0.

* cited by examiner

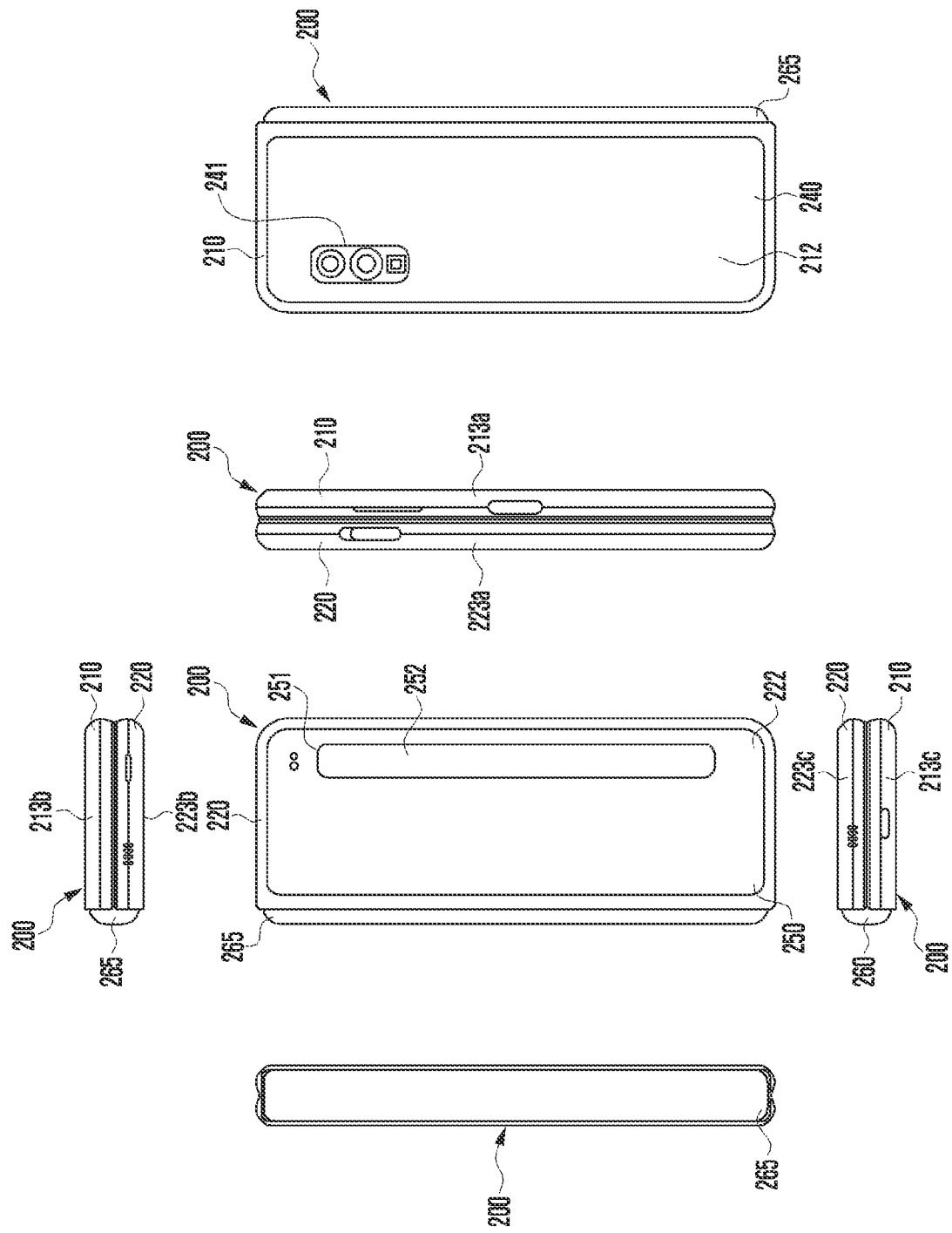

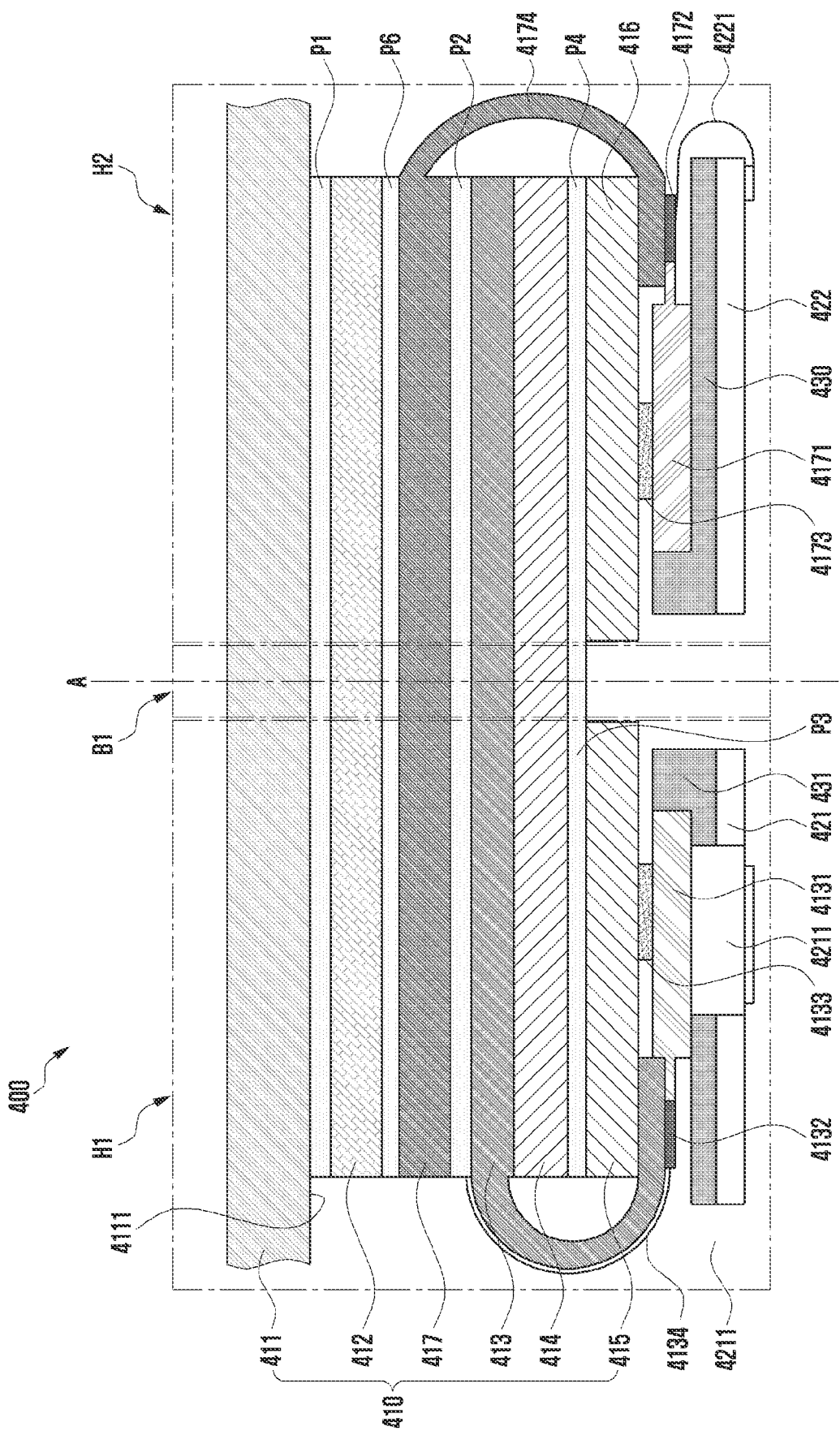

FOLDABLE ELECTRONIC DEVICE INCLUDING INTEGRATED GROUND STRUCTURE

CROSS-REFERENCE TO RELATED APPLICATION

This application is a Continuation of U.S. application Ser. No. 16/783,463, filed Feb. 6, 2020, which claims priority to KR 10-2019-0019344, filed Feb. 19, 2019, the entire contents of which are all hereby incorporated herein by reference in their entireties.

BACKGROUND

Field

The disclosure relates to a foldable electronic device including an integrated ground structure.

Description of Related Art

One of current trends in developing electronic devices to meet customer's demands is slimming a device body, that is, reducing a thickness of the electronic device. In addition, such electronic devices are being developed to increase their stiffness, strengthen their design aspects, and differentiate their functional features.

The electronic devices are being also developed to have various shapes, departing from a traditional, uniform rectangular shape. One example of such developments is to realize a foldable structure of the electronic device such that a large-screen display can be folded, when carried, and unfolded when used. This foldable-type electronic device requires an efficient electrical connection structure between at least two separated housings.

Normally, the foldable electronic device may include a first housing and a second housing connected to each other through a hinge. In the foldable electronic device, the hinge allows each housing to relatively rotate in a range of 0 to 180 degrees (e.g., in-folding operation) or allows each housing to relatively rotate in a range of 0 to 360 degrees (e.g., out-folding operation). The large-screen display of the foldable electronic device may be disposed to cover both the first housing and the second housing in an open (e.g., unfolded) state of 180 degrees.

A typical electronic device (e.g. a bar-type electronic device) having a single housing may include a conductive plate that is disposed on the back of the display in an inner space of the housing to reinforce a structural rigidity by supporting the display and to offer a noise shielding function. The conductive plate may be electrically coupled through an electrical connection member to a ground of a printed circuit board (PCB) disposed inside the electronic device.

On the other hand, in the foldable electronic device where the first housing and the second housing are physically separated at the hinge, a conductive plate having a non-foldable property has to be divided into two and disposed in the respective housings. Therefore, one conductive plate disposed in one housing is electrically connected to the ground of the PCB, whereas the other conductive plate disposed in the other housing cannot have an electric ground structure. Unfortunately, this may often cause a failure in the display such as a flickering phenomenon.

SUMMARY

Embodiments of the disclosure provide a foldable electronic device including an integrated ground structure.

According to various example embodiments of the disclosure, an electronic device may include a housing that includes: a hinge; a first housing connected to the hinge and including a first surface facing a first direction, a second surface facing a second direction opposite to the first direction, and a first lateral member at least partially surrounding a first space between the first surface and the second surface; and a second housing connected to the hinge and including a third surface facing a third direction, a fourth surface facing a fourth direction opposite the third direction, and a second lateral member at least partially surrounding a second space between the third surface and the fourth surface, wherein the first and second housings are rotatably coupled with each other through the hinge to allow the electronic device to be in a folded state or an unfolded state, wherein the first surface faces the third surface in the folded state, and wherein the first and third directions are equal to each other in the unfolded state. The electronic device may further include a first printed circuit board (PCB) disposed in the first space; a second PCB disposed in the second space; at least one wiring member electrically connecting the first and second PCBs; a window disposed over the first surface, the hinge, and the third surface; a display disposed on a rear surface of the window and including a display panel at least partially extending to the first space, having a first flexible PCB (FPCB) electrically connected to a ground of the first PCB, the display disposed to be viewable through the window; a polymer member disposed on a rear surface of the display panel; a first conductive member disposed on a rear surface of the polymer member in the first space and electrically connected to the first FPCB; and a second conductive member disposed on the rear surface of the polymer member in the second space; and a supporting member disposed between the second conductive member and the second PCB in the second space and including, at least in part, a conductive region. The second conductive member is electrically connected to the second PCB through the conductive region and electrically connected to the ground of the first PCB through the wiring member.

According to various example embodiments of the disclosure, an electronic device may include a housing including: a hinge; a first housing connected to the hinge and including a first surface facing a first direction, a second surface facing a second direction opposite to the first direction, and a first lateral member at least partially surrounding a first space between the first surface and the second surface; and a second housing connected to the hinge and including a third surface facing a third direction, a fourth surface facing a fourth direction opposite the third direction, and a second lateral member at least partially surrounding a second space between the third surface and the fourth surface, wherein the first and second housings are rotatably coupled with each other through the hinge to allow the electronic device to be in a folded state or an unfolded state, wherein the first surface faces the third surface in the folded state, and wherein the first and third directions are equal to each other in the unfolded state. The electronic device may further include a first printed circuit board (PCB) disposed in the first space; a window disposed over the first surface, the hinge, and the third surface; a display disposed on a rear surface of the window and including a display panel at least partially extending to the first space, having a first flexible PCB (FPCB) electrically connected to a ground of the first PCB, and the display being disposed to be viewable through the window; a polymer member disposed on a rear surface of the display panel; a first conductive member disposed on a rear surface of the polymer member in the first space and electrically connected to the first FPCB; and a second conductive member disposed on the rear surface of the polymer member in the second space; and a conductive adhesive member disposed between the polymer member and each of the first and second conductive members. The second conductive member is electrically connected to the ground of the first PCB through the conductive adhesive member.

According to various example embodiments of the disclosure, an electronic device may include a housing including: a hinge; a first housing connected to the hinge and including a first surface facing a first direction, a second surface facing a second direction opposite the first direction, and a first lateral member at least partially surrounding a first space between the first surface and the second surface; and a second housing connected to the hinge and including a third surface facing a third direction, a fourth surface facing a fourth direction opposite the third direction, and a second lateral member at least partially surrounding a second space between the third surface and the fourth surface, wherein the first and second housings are rotatably coupled with each other through the hinge to allow the electronic device to be in a folded state or an unfolded state, wherein the first surface faces the third surface in the folded state, and wherein the first and third directions are equal to each other in the unfolded state. The electronic device may further include a first printed circuit board (PCB) disposed in the first space; a second PCB disposed in the second space; at least one wiring member electrically connecting the first and second PCBs; a window disposed over the first surface, the hinge, and the third surface; and a display disposed on a rear surface of the window and including a display panel at least partially extending to the first space, having a first flexible PCB (FPCB) electrically connected to a ground of the first PCB, and disposed to be viewable through the window; a polymer member disposed on a rear surface of the display panel; a first conductive member disposed on a rear surface of the polymer member in the first space and electrically connected to the first FPCB; and a second conductive member disposed on the rear surface of the polymer member in the second space. The second conductive member is electrically connected to the first conductive member through at least a portion of the wiring member.

According to various example embodiments of the disclosure, an electronic device may include a housing including: a hinge; a first housing connected to the hinge and including a first surface facing a first direction, a second surface facing a second direction opposite the first direction, and a first lateral member at least partially surrounding a first space between the first surface and the second surface; and a second housing connected to the hinge and including a third surface facing a third direction, a fourth surface facing a fourth direction opposite the third direction, and a second lateral member at least partially surrounding a second space between the third surface and the fourth surface, wherein the first and second housings are rotatably coupled with each other through the hinge to allow the electronic device to be in a folded state or an unfolded state, wherein the first surface faces the third surface in the folded state, and wherein the first and third directions are equal to each other in the unfolded state. The electronic device may further include a first printed circuit board (PCB) disposed in the first space; a second PCB disposed in the second space; at least one wiring member electrically connecting the first and second PCBs; a window disposed over the first surface, the hinge, and the third surface; and a display disposed on a rear surface of the window and including a display panel at least partially extending to the first space, having a first flexible PCB (FPCB) electrically connected to a ground of the first PCB, and disposed to be viewable through the window; a touch panel disposed between the window and the display panel, at least partially extending to the second space, and having a second FPCB electrically connected to the second PCB; a polymer member disposed on a rear surface of the display panel; a first conductive member disposed on a rear surface of the polymer member in the first space and electrically connected to the first FPCB; and a second conductive member disposed on the rear surface of the polymer member in the second space and electrically connected to the second FPCB. The second conductive member is electrically connected to the ground of the first PCB through the second PCB and the wiring member.

BRIEF DESCRIPTION OF THE DRAWINGS

The above and other aspects, features and advantages of certain embodiments of the disclosure will be more apparent from the following detailed description, taken in conjunction with the accompanying drawings, in which:

FIG. 2B is a diagram illustrating a folded state of the electronic device shown in FIG. 2A, according to various embodiments;

FIG. 8 is a partial cross-sectional view illustrating an example electronic device according to various embodiments.

DETAILED DESCRIPTION

Hereinafter, various example embodiments of the disclosure will be described in greater detail with reference to accompanying drawings.

The following description with reference to accompanying drawings is provided to assist in a comprehensive understanding of various example embodiments of the disclosure. It includes various details to assist in that understanding but these are to be regarded as merely examples. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used to provide a clear understanding of the disclosure. Accordingly, it should be apparent to those skilled in the art that the following description of various example embodiments of the disclosure are provided for illustrative purposes only and not for the purpose of limiting the disclosure.

It is to be understood that the singular forms "a," "an," and "the" include plural referents unless the context clearly dictates otherwise. Thus, for example, reference to "a component surface" may include reference to one or more of such surfaces.

Figure 1:
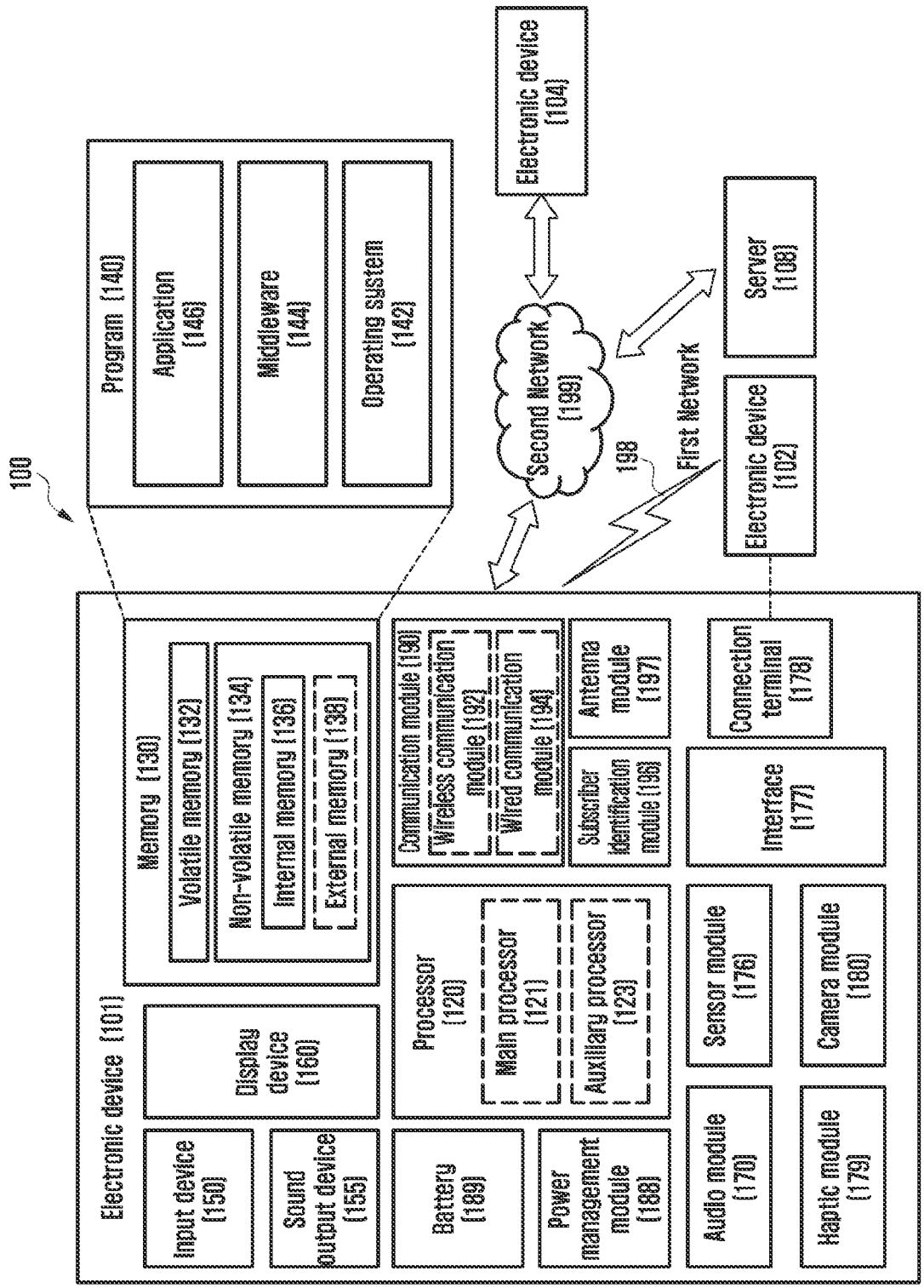
FIG. 1 is a block diagram illustrating an example electronic device in a network environment according to various embodiments.

FIG. 1 is a block diagram illustrating an example electronic device in a network environment according to an embodiment of the disclosure.

Referring to FIG. 1, in a network environment 100, an electronic device 101 may communicate with a first external electronic device 102 through a first network 198 (e.g., short-range wireless communication network) or may communicate with a second external electronic device 104 or a server 108 through a second network 199 (e.g., long-distance wireless communication network). In an example embodiment, the electronic device 101 may communicate with the second external electronic device 104 through the server 108. According to an embodiment, the electronic device 101 may include a processor 120, a memory 130, an input unit 150, a sound output unit 155, a display unit 160, an audio module 170, a sensor module 176, an interface 177, a haptic module 179, a camera module 180, a power management module 188, a battery 189, a communication module 190, a subscriber identification module 196, and an antenna module 197. In an example embodiment, at least one component (e.g., the display unit 160 or the camera module 180) among the components of the electronic device 101 may be omitted, or other components may be added to the electronic device 101. In an example embodiment, some of these components may be implemented as an integrated circuit. For example, the sensor module 176 (e.g., fingerprint sensor, iris sensor, or illuminance sensor) may be embedded in the display unit 160 (e.g., display).

The processor 120 may execute, for example, software (e.g., a program 140) to control at least one of other components (e.g., hardware component or software component) of the electronic device 101 connected to the processor 120, and may process a variety of data or perform various computations. In an example embodiment, as part of data processing or computation, the processor 120 may load a command or data received from other components (e.g., the sensor module 176 or the communication module 190) into the volatile memory 132, process the command or data stored in the volatile memory 132, and store the result data in nonvolatile memory 134. In an example embodiment, the processor 120 may include a main processor 121 (e.g., central processing unit, or application processor), and a secondary processor 123 (e.g., graphics processing unit, image signal processor, sensor hub processor, or communication processor), which may operate independently of or in cooperation with the main processor 121. Additionally or alternatively, the secondary processor 123 may consume less power or may be more specialized in a specific function compared with the main processor 121. The secondary processor 123 may be implemented separately from or as part of the main processor 121.

The secondary processor 123 may control at least some of the functions or states associated with at least one component (e.g., the display unit 160, the sensor module 176, or the communication module 190) among the components of the electronic device 101, for example, instead of the main processor 121 while the main processor 121 is in an inactive (e.g., sleep) state, or together with the main processor 121 while the main processor 121 is in an active (e.g., application execution) state. In an example embodiment, the secondary processor 123 (e.g., image signal processor or communication processor) may be implemented as a part of another component (e.g., the camera module 180 or the communication module 190) that is functionally related to the secondary processor 123.

The memory 130 may store a variety of data used by at least one component (e.g., the processor 120 or the sensor module 176) of the electronic device 101. The data may include, for example, software (e.g., the program 140) and input data or output data for commands associated with the software. The memory 130 may include the volatile memory 132 or the nonvolatile memory 134.

The programs 140 may be stored in the memory 130 as software, and may include, for example, an operating system 142, a middleware 144, or an application 146.

The input unit 150 may receive a command or data, which can be to be used for a component (e.g., the processor 120) of the electronic device 101, from the outside of the electronic device 101 (e.g., user). The input unit 150 may include, for example, a microphone, a mouse, a keyboard, or a digital pen (e.g., stylus pen).

The sound output unit 155 may output a sound signal to the outside of the electronic device 101. The sound output unit 155 may include, for example, a speaker and a receiver. The speaker may be used for general purposes, such as playback of multimedia or recordings, and the receiver may be used for receiving an incoming call. In an example embodiment, the receiver may be implemented separately from or as part of the speaker.

The display unit 160 may visually present information to the outside of the electronic device 101 (e.g., user). The display unit 160 may include, for example, a display, a hologram device, or a projector, and a control circuit for controlling these. In an example embodiment, the display unit 160 may include a touch circuitry configured to sense a touch, or a sensing circuitry (e.g., pressure sensor) configured to measure the strength of a force caused by a touch action.

The audio module 170 may convert a sound into an electric signal or convert an electric signal into a sound. In an example embodiment, the audio module 170 may obtain a sound signal through the input unit 150 or may output a sound signal through an external electronic device (e.g., the first external electronic device 102 (e.g., speaker or headphone)) wiredly or wirelessly connected to the sound output unit 155 or the electronic device 101.

The sensor module 176 may generate an electrical signal or a data value corresponding to the operating state (e.g., power or temperature) of the electronic device 101 or the environmental state (e.g., user state) outside the electronic device 101. The sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support one or more designated protocols that enable the electronic device 101 to directly or wirelessly connect to an external electronic device (e.g., the first external electronic device 102). In an example embodiment, the interface 177 may include, for example, a high-definition multimedia interface (HDMI), a universal serial bus (USB) interface, an SD card interface, or an audio interface.

The connection terminal 178 may include a connector through which the electronic device 101 can be physically connected to an external electronic device (e.g., the first external electronic device 102). In an example embodiment, the connection terminal 178 may include, for example, an HDMI connector, a USB connector, a secure digital (SD) card connector, or an audio connector (e.g., headphone connector).

The haptic module 179 may convert an electrical signal into a mechanical stimulus (e.g., vibration or motion) or an electrical stimulus that can be perceived by the user through tactile or kinesthetic senses. In an example embodiment, the haptic module 179 may include, for example, a motor, a piezoelectric element, or an electric stimulator.

The camera module 180 may capture a still image or a moving image. In an example embodiment, the camera module 180 may include at least one lens, an image sensor, an image signal processor, or a flash.

The power management module 188 may manage the power supplied to the electronic device 101. The power management module 188 may be implemented as part of a power management integrated circuit (PMIC).

The battery 189 may supply power to at least one component of the electronic device 101. In an example embodiment, the battery 189 may include, for example, a non-rechargeable primary cell, a rechargeable secondary cell, or a fuel cell.

The communication module 190 may establish a wired or wireless communication channel between the electronic device 101 and the external electronic device (e.g., the first external electronic device 102, the second external electronic device 104, or the server 108) and support communication through the established communication channel. The communication module 190 may include at least one communication processor that can operate separately from the processor 120 (e.g., application processor) to support wired or wireless communication. In an example embodiment, the communication module 190 may include a wireless communication module 192 (e.g., cellular communication module, short-range wireless communication module, or global navigation satellite system (GNSS) communication module), or a wired communication module 194 (e.g., local area network (LAN) communication module, or power line communication module). The corresponding communication module may communicate with an external electronic device through the first network 198 (e.g., short-range communication network such as Bluetooth, Wi-Fi direct, or infrared data association (IrDA)) or through the second network 199 (e.g., long-distance communication network such as a cellular network, the Internet, or a computer network like a LAN or WAN). The above various communication modules may be implemented as one component (e.g., single chip) or as separate components (e.g., multiple chips). The wireless communication module 192 may identify and authenticate the electronic device 101 in the communication network such as the first network 198 or the second network 199 by using subscriber information stored in the subscriber identification module 196.

The antenna module 197 may transmit or receive a signal or power to or from the outside (e.g., the external electronic devices 102 or 104). In an example embodiment, the antenna module 197 may include one antenna having a radiator made of a conductor or conductive pattern formed on a substrate (e.g., PCB). In an example embodiment, the antenna module 197 may include a plurality of antennas. In this case, at least one antenna suitable for the communication scheme used in the communication network such as the first network 198 or the second network 199 may be selected from the plurality of antennas by, for example, the communication module 190. The signal or power may be transmitted or received between the communication module 190 and the external electronic devices 102 or 104 through the selected at least one antenna. In an example embodiment, in addition to the radiator, another component (e.g., radio frequency integrated circuit (RFIC)) may be further formed as part of the antenna module 197.

At least some of the above components may be connected to each other via a communication scheme between peripherals (e.g., bus, general purpose input and output (GPIO), serial peripheral interface (SPI), or mobile industry processor interface (MIPI)), and may exchange signals (e.g., commands or data) with each other.

In an example embodiment, commands or data may be exchanged between the electronic device 101 and the second external electronic device 104 through the server 108 connected to the second network 199. The external electronic devices 102 and 104 may be of the same type as or a different type from the electronic device 101. In an example embodiment, all or some of the operations that can be performed by the electronic device 101 may be performed by one or more of the external electronic devices 102, 104 and 108. For example, to perform a certain function or service automatically or upon request, the electronic device 101 may, instead of or in addition to executing the function or service, request one or more external electronic devices to execute at least some of the function or service. Upon reception of the request, the external electronic devices may execute at least a portion of the requested function or service or an additional function or service related to the request, and return the execution results to the electronic device 101. The electronic device 101 may further process the received results if necessary and provide the processing results as a response to the requested function or service. To this end, technologies such as cloud computing, distributed computing, and client-server computing may be used.

The electronic device according to various embodiments disclosed herein can be one of various types of devices, such as, for example, and without limitation, portable communication devices (e.g., smartphones), computers, portable multimedia devices, portable medical instruments, cameras, wearable devices, home appliances, or the like. However, the electronic device is not limited to the above-mentioned devices.

It should be understood that the various example embodiments of the disclosure and the terminology used herein are not intended to limit the disclosure to specific embodiments but to include various modifications, equivalents, and/or alternatives thereof. In the drawings, the same or similar reference symbols are used to refer to the same or like parts. In the description, the singular forms "a", "an" and "the" are intended to include the plural forms as well, unless the context clearly indicates otherwise. In the description, the expression "A or B", "at least one of A and/or B", "A, B or C", or "at least one of A, B and/or C" may indicate all possible combinations of the listed items. The terms "first" and "second" may refer to various elements regardless of importance and/or order and are used to distinguish one element from another element without limitation. It will be understood that when an element (e.g., first element) is referred to as being (functionally or communicatively) "coupled with/to" or "connected with/to" another element (e.g., second element), it can be coupled or connected with/to the other element directly (e.g., wiredly), wirelessly, or via a third element.

In the description, the term "module" may refer to a certain unit that is implemented in hardware, software, firmware, or a combination thereof. The term "module" may be used interchangeably with the term "unit", "logic", "logical block", "component", or "circuit", for example. The module may be the minimum unit, or a part thereof, which performs one or more particular functions. For example, a module may be implemented in the form of an application-specific integrated circuit (ASIC).

Various embodiments of the disclosure may be implemented in software (e.g., the programs 140) including instructions stored in a machine-readable storage medium (e.g., internal memory 136 or external memory 138) readable by a machine (e.g., the electronic device 101). For example, the processor (e.g., the processor 120) of the machine (e.g., the electronic device 101) can fetch a stored instruction from a storage medium and execute the fetched instruction. When the instruction is executed by the processor, the machine may perform the function corresponding to the instruction. The instructions may include a code generated by a compiler and a code executable by an interpreter. The machine-readable storage medium may be provided in the form of a non-transitory storage medium. Here, the "non-transitory" storage medium may not include a signal and is tangible, but does not distinguish whether data is stored semi-permanently or temporarily in the storage medium.

The method according to various embodiments disclosed herein may be provided as a computer program product. A computer program product may be traded between a seller and a purchaser as a commodity. A computer program product may be distributed in the form of a machine-readable storage medium (e.g., compact disc read only memory (CD-ROM)) or be distributed online (e.g., download or upload) directly between two user devices (e.g. smartphones) through an application store (e.g., PlayStore™). For on-line distribution, at least a portion of the computer program product may be temporarily stored or temporarily created in a storage medium such as a memory of a manufacturer's server, an application store's server, or a relay server.

Each of the components (e.g., modules or programs) according to various embodiments described above may comprise one or more elements. An existing component may be omitted, and a new component may be added. Alternatively or additionally, some of the components (e.g., modules or programs) may be combined into one entity while maintaining the same functionality. Operations supported by a module, program, or another component may be carried out in sequence, in parallel, by repetition, or heuristically. Some operations may be executed in a different order or may be omitted, and a new operation may be added.

Figure 2A:
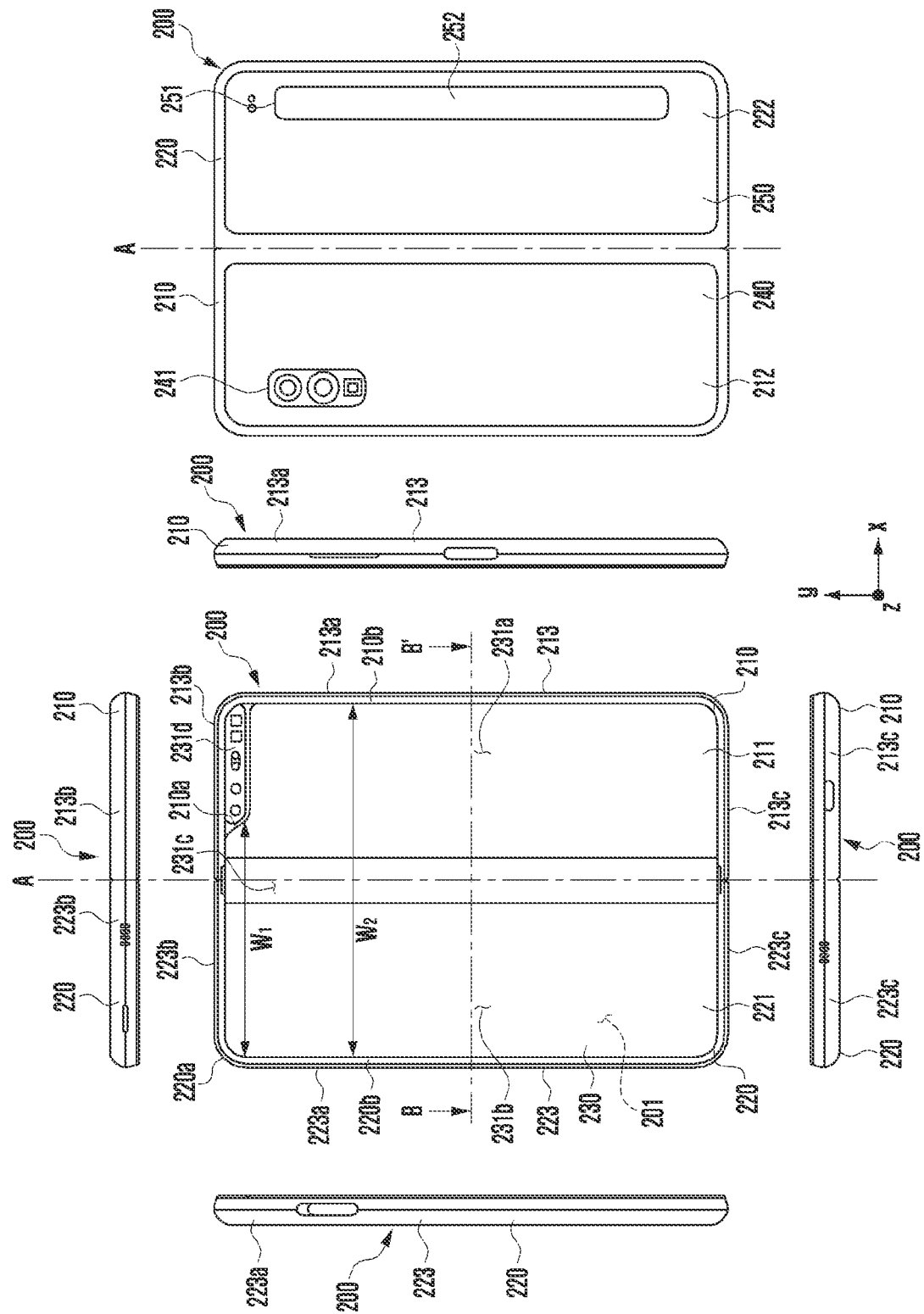
FIG. 2A is a diagram illustrating an unfolded state of an example electronic device according to various embodiments.

FIG. 2A is a diagram illustrating an unfolded state of an example electronic device 200 according to various embodiments. FIG. 2B is a diagram illustrating a folded state of the electronic device 200 shown in FIG. 2A.

The electronic device 200 shown in FIGS. 2A and 2B may be similar, at least in part, to the electronic device 101 shown in FIG. 1, or may include other embodiments of the electronic device.

Figure 3:
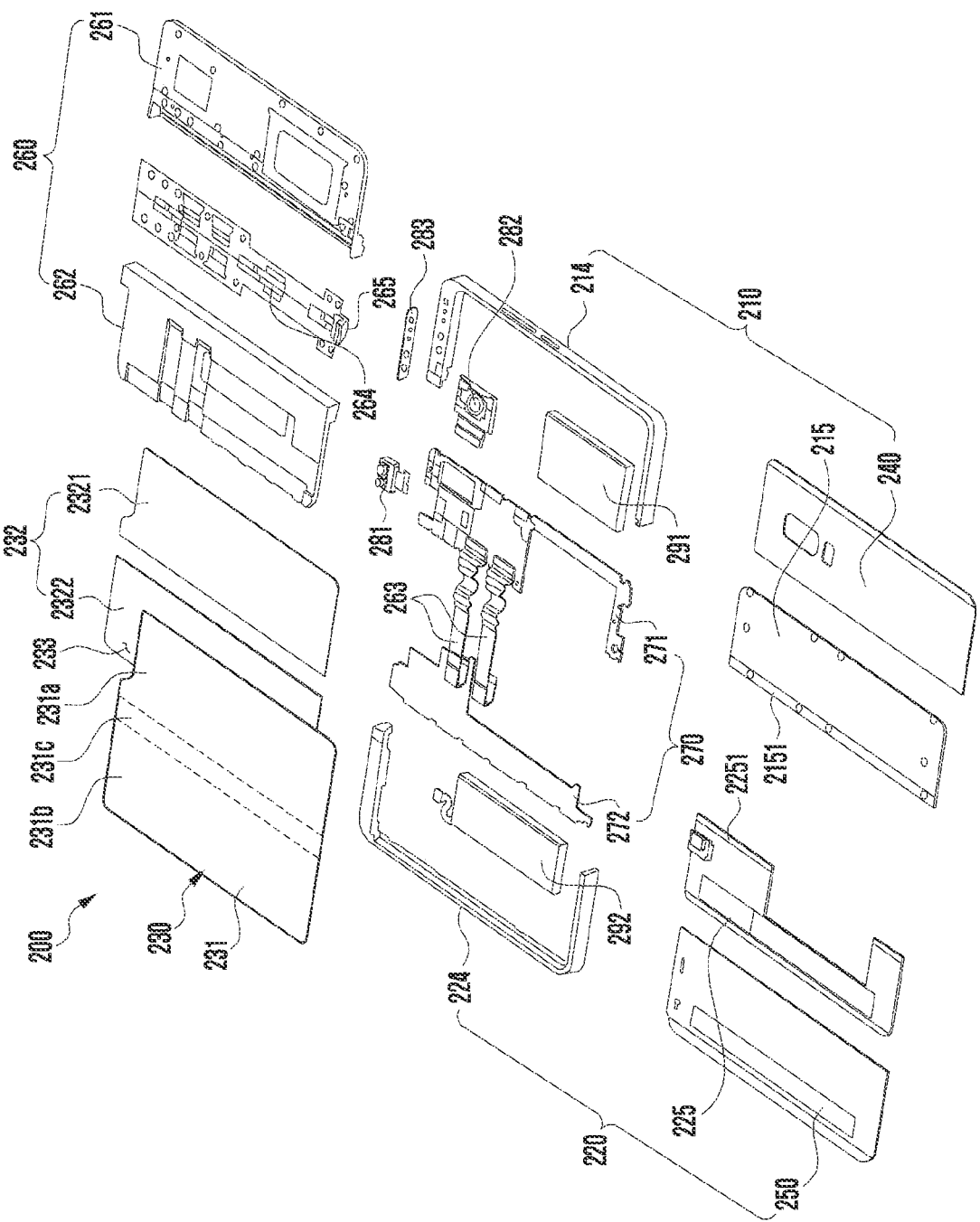
FIG. 3 is an exploded perspective view illustrating an example electronic device according to various embodiments.

Referring to FIGS. 2A and 2B, the electronic device 200 may include a foldable housing (also referred to as a foldable housing structure) including a pair of housings 210 and 220 that are rotatably combined with each other through a hinge (e.g., a hinge 264 in FIG. 3, also referred to as a hinge structure). In addition, the electronic device 200 may further include a hinge cover 265 that covers a foldable portion of the pair of housings 210 and 220, and a flexible or foldable display 230 that is disposed in a space formed by the pair of housings 210 and 220. In the disclosure, a surface on which the display 230 is disposed is defined as a front surface of the electronic device 200, and the opposite surface of the front surface is defined as a rear surface of the electronic device 200. Also, a surface surrounding a space between the front and rear surfaces is defined as a lateral surface of the electronic device 200.

In an embodiment, the pair of housings 210 and 220 may include a first housing 210 (also referred to as a first housing structure) having a sensor area 231d, a second housing 220 (also referred to as a second housing structure), a first rear cover 240, and a second rear cover 250. The pair of housings 210 and 220 of the electronic device 200 is not limited to the shape and configuration shown in FIGS. 2A and 2B, and may be implemented with any other shape and configuration. For example, in another embodiment, the first housing 210 and the first rear cover 240 may be integrally formed, and also the second housing 220 and the second rear cover 250 may be integrally formed.

In an embodiment, the first housing 210 and the second housing 220 are disposed at both sides with respect to a folding axis (indicated by 'A'), and may have a generally symmetric shape with respect to the folding axis (A). As will be described later, the first and second housings 210 and 220 may have different angles or distances therebetween, depending on whether the electronic device 200 is in an unfolded state (also referred to as a flat state or an open state), a folded state (also referred to as a closed state), or an intermediate state. In the illustrated embodiment, contrary to the second housing 220, the first housing 210 has the sensor area 231d in which various sensors are disposed. Excepting this, both housings may be symmetrical in shape. In another embodiment, the sensor area 231d may be alternatively or additionally disposed in the second housing 220.

In an embodiment, the first housing 210 is connected to the hinge (e.g., the hinge 264 in FIG. 3) and may include a first surface 211 corresponding to a portion of the front surface of the electronic device 200 and facing in a first direction, a second surface 212 corresponding to a portion of the rear surface of the electronic device 200 and facing in a second direction opposite to the first direction, and a first lateral member 213 partially surrounding a space between the first surface 211 and the second surface 212. In an embodiment, the first lateral member 213 may include a first lateral surface 213a disposed in parallel with the folding axis (A), a second lateral surface 213b extended perpendicularly to the folding axis (A) from one end of the first lateral surface 213a, and a third lateral surface 213c extended perpendicularly to the folding axis (A) from the other end of the first lateral surface 213a.

In an embodiment, the second housing 220 is connected to the hinge (e.g., the hinge 264 in FIG. 3) and may include a third surface 221 corresponding to a portion of the front surface of the electronic device 200 and facing in a third direction, a four surface 222 corresponding to a portion of the rear surface of the electronic device 200 and facing in a fourth direction opposite to the third direction, and a second lateral member 223 partially surrounding a space between the third surface 221 and the fourth surface 222. In an embodiment, the second lateral member 213 may include a fourth lateral surface 223a disposed in parallel with the folding axis (A), a fifth lateral surface 223b extended perpendicularly to the folding axis (A) from one end of the fourth lateral surface 223a, and a sixth lateral surface 223c extended perpendicularly to the folding axis (A) from the other end of the fourth lateral surface 223a. In the folded state, the first surface 211 and the third surface 221 may face each other. In the unfolded state, the first direction and the third direction are equal to each other.

In an embodiment, the electronic device 200 may include a recess 201 formed through a structural shape coupling of the first and second housings 210 and 220 to accommodate the display 230 therein. The recess 201 may have the substantially same size as the display 230. In an embodiment, the recess 201 may have two or more different widths in a direction perpendicular to the folding axis (A) because of the sensor area 231d. For example, the recess 201 may have a first width (w1) between a first portion 220a of the second housing 220 parallel to the folding axis (A) and a first portion 210a of the first housing 210 formed at one edge of the sensor area 231d, and a second width (w2) between a second portion 220b of the second housing 220 parallel to the folding axis (A) and a second portion 210b of the first housing 210 not corresponding to the sensor area 231d and being parallel to the folding axis (A). In this case, the second width (w2) may be greater than the first width (w1). That is, the first portion 210a of the first housing 210 and the first portion 220a of the second housing 220, which have asymmetrical shapes, form the first width (w1) of the recess 201, whereas the second portion 210b of the first housing 210 and the second portion 220b of the second housing 220, which have symmetrical shapes, form the second width (w2) of the recess 201. In an embodiment, the first portion 210a and the second portion 210b of the first housing 210 may have different distances from the folding axis (A). The width of the recess 201 is not limited to the illustrated example. In various embodiments, the recess 201 may have two or more different widths depending on the shape of the sensor area 231d or asymmetrical shapes of the first and second housings 210 and 220.

In an embodiment, at least a portion of the first and second housings 210 and 220 may be formed of a metallic or non-metallic material having a selected rigidity value to support the display 230.

In an embodiment, the sensor area 231d may be formed to occupy a certain region adjacent to one corner of the first housing 210. The arrangement, shape, and size of the sensor area 231d are not limited to the illustrated example. In another embodiment, the sensor area 231d may be formed at any other corner of the first housing 210 or at any position between top and bottom corners. In still another embodiment, the sensor area 231d may be formed in a portion of the second housing 220. In yet another embodiment, the sensor area 231d may be formed in a portion of both the first and second housings 210 and 220. In various embodiments, components for performing various functions may be embedded in the electronic device 200 and exposed to the front surface of the electronic device 200 through the sensor area 231d or through one or more openings formed in the sensor area 231d. In embodiments, such components may include at least one of a front camera device, a receiver, a proximity sensor, an illuminance sensor, an iris recognition sensor, an ultrasonic sensor, or an indicator.

In an embodiment, the first rear cover 240 may be disposed on the second surface 212 of the first housing 210, and may have a substantially rectangular periphery. The periphery may be surrounded, at least in part, by the first housing 210. Similarly, the second rear cover 250 may be disposed on the fourth surface 222 of the second housing 220, and a substantially rectangular periphery thereof may be surrounded, at least in part, by the second housing 220.

In the illustrated embodiment, the first rear cover 240 and the second rear cover 250 may have substantially symmetrical shapes with respect to the folding axis (A). In another embodiment, the first and second rear covers 240 and 250 may have various different shapes. In yet another embodiment, the first rear cover 240 may be integrally formed with the first housing 210, and the second rear cover 250 may be integrally formed with the second housing 220.

In an embodiment, the first rear cover 240, the second rear cover 250, the first housing 210, and the second housing 220 may provide together a space in which various components of the electronic device 200 (e.g., a PCB, an antenna module, a sensor module, or a battery) are disposed. In an embodiment, one or more components may be disposed near and visually exposed to the rear surface of the electronic device 200. For example, one or more components or sensors may be visually exposed through a first rear area 241 of the first rear cover 240. In various embodiments, such sensors may include a proximity sensor, a rear camera device, and/or a flash. In another embodiment, at least a portion of a sub display 252 may be visually exposed through a second rear area 251 of the second rear cover 250.

The display 230 may be disposed in a space formed by the pair of housings 210 and 220. For example, the display 230 may be mounted in the recess 201 formed by the pair of housings 210 and 220 while occupying most of the front surface of the electronic device 200. Therefore, the front surface of the electronic device 200 may include the display 230, a portion (e.g., a periphery) of the first housing 210 adjacent to the display 230, and a portion (e.g., a periphery) of the second housing 220. In addition, the rear surface of the electronic device 200 may include the first rear cover 240, a portion (e.g., a periphery) of the first housing 210 adjacent to the first rear cover 240, the second rear cover 250, and a portion (e.g., a periphery) of the second housing 220 adjacent to the second rear cover 250.

In an embodiment, the display 230 may refer to a display that allows at least a portion thereof to be deformed into a curved surface. In an embodiment, the display 230 may include a folding area 231c, a first area 231a disposed on one side (e.g., the right side) with respect to the folding area 231c, and a second area 231b disposed on the other side (e.g., the left side) with respect to the folding area 231c. For example, the first area 231a may be disposed on the first surface 211 of the first housing 210, and the second area 231b may be disposed on the third surface 221 of the second housing 220. Such divided areas of the display 230 are examples only, and the display 230 may be divided into a plurality of areas (e.g., two, four or more) according to the structure or function thereof. Although, in an embodiment shown in FIG. 2A, the display 230 is divided into areas based on the folding area 231c running in parallel with the folding axis (A) corresponding to the y-axis, the display 230 in another embodiment may be divided into areas based on another folding area running in parallel with another folding axis (e.g., corresponding to the x-axis). The above division of the display is merely a virtual division based on the pair of housings 210 and 220 and the hinge (e.g., the hinge 264 in FIG. 3). In practice, regardless of the pair of housings 210 and 220 and the hinge 264, the display 230 is capable of displaying one full screen. In an embodiment, the first area 231a and the second area 231b may have symmetrical shapes as a whole with respect to the folding area 231c. However, unlike the second area 231b, the first area 231a may have a cut portion (e.g., a cut portion 233 in FIG. 3) for exposing the sensor area 231d, resulting in an asymmetrical shape. Thus, strictly, the first and second areas 231a and 231b may have a symmetrical portion and an asymmetrical portion.

As shown in FIG. 2B, the hinge cover 265 is disposed between the first housing 210 and the second housing 220 to cover any underlying component (e.g., the hinge 264 in FIG. 3). In an embodiment, depending on whether the electronic device 200 is in the unfolded state or in the folded state, the hinge cover 265 may be hidden by a part of the first and second housings 210 and 220 or exposed to the outside.

When the electronic device 200 is in the unfolded state as shown in FIG. 2A, the hinge cover 265 may be hidden by the first and second housings 210 and 220, thus being not exposed. When the electronic device 200 is in the folded state (e.g., a completely folded state) as shown in FIG. 2B, the hinge cover 265 may be exposed to the outside between the first and second housings 210 and 220. When the electronic device 200 is in the intermediate state where the first and second housings 210 and 220 are folded with a certain angle, the hinge cover 265 may be partially exposed to the outside between the first and second housings 210 and 220. The exposed area in the intermediate state may be smaller than that in the completely folded state. In an embodiment, the hinge cover 265 may have a curved surface.

Hereinafter, in each particular state of the electronic device 200, the operations of the first and second housings 210 and 220 and the respective areas of the display 230 will be described.

In an embodiment, when the electronic device 200 is in the unfolded state (e.g., FIG. 2A), the first housing 210 and the second housing 220 are disposed to form an angle of 180 degrees with each other, and thus the first and second areas 231a and 231b of the display 230 face the same direction. In addition, the folding area 231c may form the same plane as the first and second areas 231a and 231b.

In an embodiment, when the electronic device 200 is in the folded state (e.g., FIG. 2B), the first housing 210 and the second housing 220 are disposed to face each other. Thus, the first and second areas 231a and 231b of the display 230 may form a very small angle (e.g., between 0 and 10 degrees) and face each other. In addition, the folding area 231c may form, at least in part, a curved surface having certain curvature.

In an embodiment, when the electronic device 200 is in the intermediate state, the first housing 210 and the second housing 220 are disposed to form a certain angle. Thus, the first and second areas 231a and 231b of the display 230 may form a certain angle which is greater than the angle in the folded state and smaller than the angle in the unfolded state. In addition, the folding area 231c may form, at least in part, a curved surface having certain curvature which is smaller than the curvature in the folded state.

FIG. 3 is an exploded perspective view illustrating an example electronic device 200 according to various embodiments.

Referring to FIG. 3, in an embodiment, the electronic device 200 may include the first housing 210, the second housing 220, the display 230, the first rear cover 240, and the second rear cover 250 all of which are described above. The electronic device 200 may further include a supporting member assembly 260 and at least one printed circuit board (PCB) 270. The display 230 may be also referred to as a display module, a display assembly, or a display unit.

The display 230 may include a display panel 231 (e.g., a flexible display panel) and at least one plate or layer 232 on which the display panel 231 is mounted. In an embodiment, the plate 232 may be disposed between the display panel 231 and the supporting member assembly 260. The display panel 231 may be disposed on one surface of the plate 232. The plate 232 may be divided into a first plate 2321 and a second plate 2232, based on the hinge 264. The plate 232 may include at least one member that cannot be folded together when the first and second housings 210 and 220 are rotated about the hinge 264 to the folded state or the unfolded state. The plate 232 may include at least one subsidiary layer (e.g., a graphite member) and/or a conductive layer (e.g., a copper sheet), which face the rear surface of the display panel 231. In an embodiment, the plate 232 may be formed in a shape corresponding to the display panel 231. For example, a portion of the first plate 2321 may be formed in a shape corresponding to the cut portion 233 of the display panel 231.

The supporting member assembly 260 may include a first supporting member 261, a second supporting member 262, the hinge 264 disposed between the first and second supporting members 261 and 262, the hinge cover 265 covering the hinge 264 (when viewing the hinge 264 from the outside), and at least one wiring member 263 (e.g., a flexible printed circuit board (FPC)) intersecting with the first and second supporting members 261 and 262.

In an embodiment, the supporting member assembly 260 may be disposed between the plate 232 and the at least one PCB 270. For example, the first supporting member 261 may be disposed between the first area 231a of the display 230 and a first PCB 271, and the second supporting member 262 may be disposed between the second area 231b of the display 230 and a second PCB 272.

In an embodiment, the wiring member 263 and the hinge 264 may be disposed, at least in part, inside the supporting member assembly 260. The wiring member 263 may be disposed in a direction (e.g., the x-axis direction) that crosses the first and second supporting members 261 and 262. That is, the wiring member 263 may be disposed in a direction perpendicular to the folding axis (e.g., the y-axis or the folding axis (A) in FIG. 2A) of the folding area 231c.

As mentioned above, the at least one PCB 270 may include the first PCB 271 disposed to correspond to the first supporting member 261, and the second PCB 272 disposed to correspond to the second supporting member 262. The first and second PCBs 271 and 272 may be disposed in a space formed by all of the supporting member assembly 260, the first housing 210, the second housing 220, the first rear cover 240, and the second rear cover 250. On the first and second PCBs 271 and 272, electronic components for implementing various functions of the electronic device 200 may be mounted.

In an embodiment, the first housing 210 may include a first sliding bracket 214 disposed to allow a sliding motion of the first supporting member 261, a first rear plate 215 disposed to face the first supporting member 261, and the first rear cover 240 combined with the first rear plate 215. Similarly, the second housing 220 may include a second sliding bracket 224 disposed to allow a sliding motion of the second supporting member 262, a second rear plate 225 disposed to face the second supporting member 262, and the second rear cover 250 combined with the second rear plate 225. In a space between the first supporting member 261 and the first rear plate 215, the first PCB 271, a first battery 291, at least one sensor 281, or at least one camera 282 may be disposed. The first sliding bracket 214 may include a window glass 283 disposed at a position corresponding to the cut portion 233 of the display 230 to protect the sensor 281 and the camera 282. In a space between the second supporting member 262 and the second rear plate 225, the second PCB 272 and a second battery 292 may be disposed. In a certain embodiment, the first rear plate 215 and the second rear plate 225 may be omitted. In this case, instead of the first and second rear plates 215 and 225, the first and second rear covers 240 and 250 may directly contribute to forming the space of the housings 210 and 220.

In an embodiment, the first rear plate 215 may have a first rotation supporting surface 2151, and the second rear plate 225 may have a second rotation supporting surface 2251 corresponding to the first rotation supporting surface 2151. Each of the first and second rotation supporting surfaces 2151 and 2251 may have a curved surface corresponding to the curved surface included in the hinge cover 265.

In an embodiment, when the electronic device 200 is in the unfolded state (e.g., FIG. 2A), the first and second rotation supporting surfaces 2151 and 2251 cover the hinge cover 265 so that the hinge cover 265 may not be exposed or may be minimally exposed to the rear surface of the electronic device 200. In addition, when the electronic device 200 is in the folded state (e.g., FIG. 2B), the first and second rotation supporting surfaces 2151 and 2251 rotate along the curved surfaces included in the hinge cover 265 so that the hinge cover 265 may be maximally exposed to the rear surface of the electronic device 200.

Figure 4:
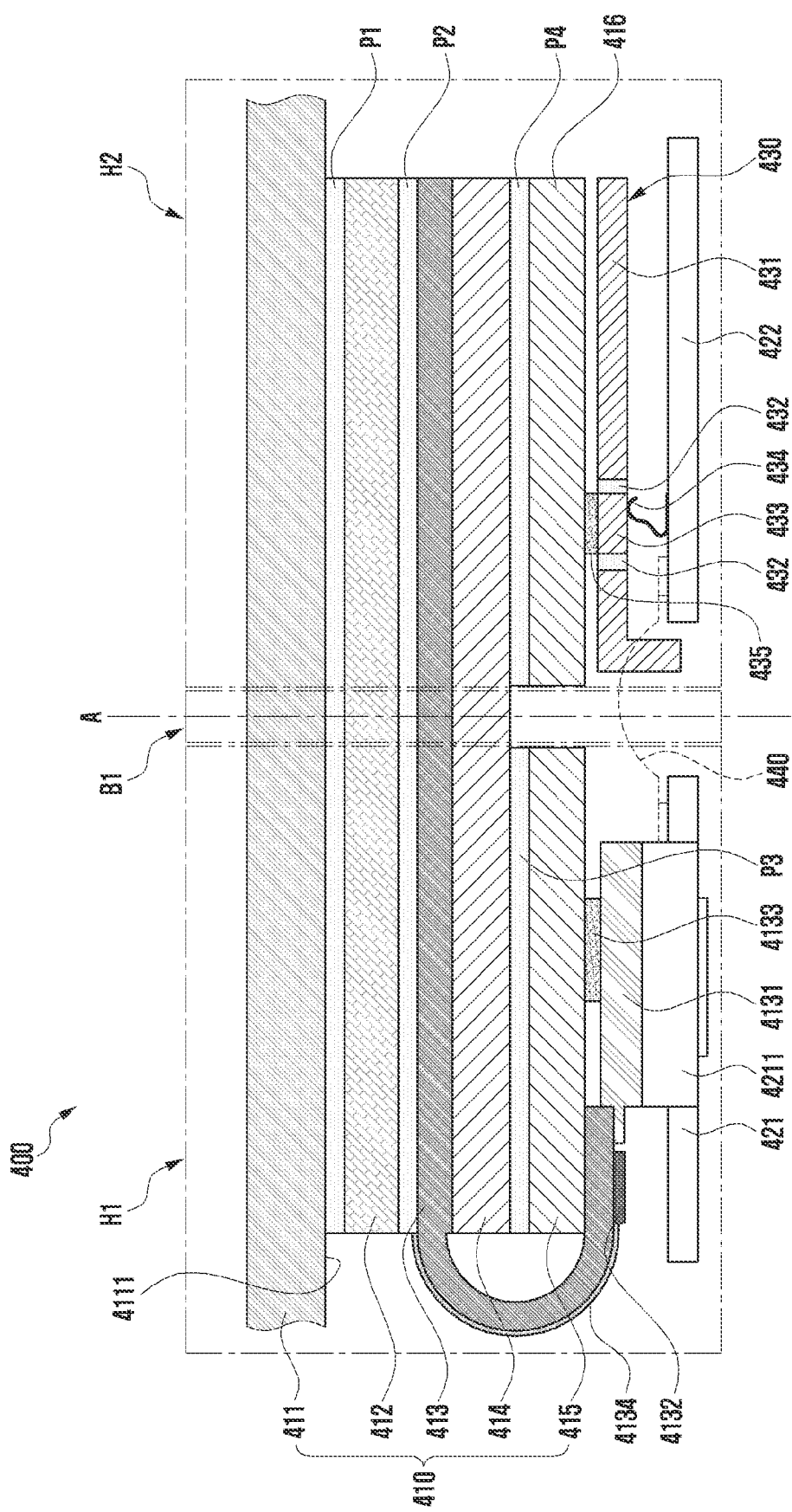
FIG. 4 is a partial cross-sectional view taken along the line B-B' of FIG. 2A according to various embodiments.

FIG. 4 is a partial cross-sectional view taken along the line B-B' of FIG. 2A.

An electronic device 400 shown in FIG. 4 may be similar, at least in part, to the electronic device 101 shown in FIG. 1 or the electronic device 200 shown in FIGS. 2A to 3, or may include other embodiments of the electronic device.

Referring to FIG. 4, the electronic device 400 (e.g., the electronic device 200 in FIG. 2A) may include a first housing area H1 and a second housing area H2 which are disposed to be foldable with respect to each other, based on a folding area B1 having a folding axis A. According to an embodiment, the first housing 210 shown in FIG. 2A may be disposed in the first housing area H1, and the second housing 220 shown in FIG. 2A may be disposed in the second housing area H2. In addition, the hinge 264 shown in FIG. 3 may be disposed in the folding area B1.

According to various embodiments, the electronic device 400 may include a display 410. In an embodiment, the electronic device 400 may include a first PCB 421 disposed under the display 410 in the first housing area H1. In addition, the electronic device 400 may include a second PCB 422 disposed under the display 410 in the second housing area H2. Further, the electronic device 400 may include at least one wiring member 440 (e.g., the wiring member 263 in FIG. 3) connected to both the first and second PCBs 421 and 422 through the folding area B1. In an embodiment, the wiring member 440 may include at least one flexible printed circuit board (FPCB).

According to various embodiments, the display 410 may include a window 411 (e.g., a polyimide (PI) film) and may also include a polarizer (POL) 412 (e.g., a polarizing film), a display panel 413, a polymer member 414, and a pair of conductive members 415 and 416 all of which are sequentially disposed under the window 411. In an embodiment, the window 411, the polarizer 412, the display panel 413, and/or the polymer member 414 are disposed all over the first housing area H1, the folding area B1, and the second housing area H2, and thus each of them includes a portion corresponding to the folding area B1 and capable of being folded or unfolded when the electronic device 400 is folded or unfolded. On the other hand, the pair of conductive members 415 and 416 having no foldability include a first conductive member 415 disposed in the first housing area H1 and a second conductive member 416 disposed in the second housing area H2, having no portion corresponding to the folding area B1. In an embodiment, the window 411, the polarizer 412, the display panel 413, the polymer member 414, and the pair of conductive members 415 and 416 may be attached to each other through adhesive members P1, P2, P3, and P4. For example, the adhesive members P1, P2, P3, and P4 may include an optical clear adhesive (OCA), a pressure sensitive adhesive (PSA), a thermally reactive adhesive, a normal adhesive, or a double-sided adhesive tape. In an embodiment, the polymer member 414 may have a dark color (e.g., black) to assist in expressing a background when the display is turned off. In an embodiment, the polymer member 414 may act as a shock absorbing member for absorbing an impact from the outside of the electronic device 400 to prevent and/or reduce the breakage of the display 410. In an embodiment, the conductive members 415 and 416 formed of metal plates may reinforce the rigidity of the electronic device 400, shield ambient noise, and dissipate heat from nearby components. In an embodiment, each of the conductive members 415 and 416 may include, for example, copper (Cu), aluminum (Al), stainless steel, or a clad metal (e.g., a stack of different kinds of metals such as Al and stainless steel). In another embodiment, the pair of conductive members 415 and 416 may be formed of different conductive materials, respectively, depending on a heat dissipation mechanism and component arrangement structure of the electronic device 400.

According to various embodiments, at least one functional member may be disposed between the polymer member 414 and the conductive members 415 and 416. For example, the functional member may include a graphite sheet for heat dissipation, an added display, a force touch FPCB, a fingerprint sensor FPCB, a communication antenna radiator, a heat dissipation sheet, a conductive/nonconductive tape, or an open cell sponge. In an embodiment, when a foldable material is used, the functional member may be disposed all over the first housing area H1, the second housing area H2, and the folding area B1. In another embodiment, when a non-foldable material is used, the functional member may be separately disposed in each of the first housing area H1 and the second housing area H2 except for the folding area B1.

According to various embodiments, the pair of conductive members 415 and 416 may be electrically connected to a ground of the electronic device 400 to prevent and/or reduce a failure such as a flickering phenomenon in the display 410 due to ambient noise.

According to various embodiments, the display 410 may include a bendable portion 4134 that is extended from the display panel 413 and then bent toward and disposed on the rear surface of the first conductive member 415. In an embodiment, the display 410 may include a first FPCB 4131 having a conductive region (e.g., a ground region) that is electrically connected to an end of the bendable portion 4134, exposed at least in part, and attached to the first conductive member 415 through a conductive tape 4133. In an embodiment, a control circuit 4132 may be mounted on the bendable portion 4134 of the display panel 413. In an embodiment, the control circuit 4132 may include a display driver IC (DDI) or a touch display driver IC (TDDI). In an embodiment, the DDI or the TDDI may have a chip on panel (COP) structure disposed on the bendable portion 4134 of the display panel 413.

According to various embodiments, the first FPCB 4131 may be attached, at least in part, and electrically connected to the first conductive member 415 through the conductive tape 4133. In an embodiment, the display panel 413 may be electrically connected to the first PCB 421 through a first electrical connection member 4211 connected from the first FPCB 4131 to the first PCB 421. For example, the first electrical connection member 4211 may be an FPCB containing a connector therein. In another embodiment, the first FPCB 4131 may be directly connected to the first PCB 421 through a separate conductive connector. In an embodiment, the first electrical connection member 4211 may be used for delivery of a control signal between the first PCB 421 and the display panel 413 and may include a ground wiring path. Accordingly, the first conductive member 415 may have a ground structure that is electrically connected to a ground of the first PCB 421 through the conductive tape 4133, the first FPCB 4131 connected to the display panel 413, and the first electrical connection member 4211.

According to various embodiments, the second conductive member 416 may have a ground structure that is electrically connected to a ground of the second PCB 422 disposed in the second housing area H2. In an embodiment, the electronic device 400 may include at least one supporting member 430 (e.g., the second supporting member 262 in FIG. 3) disposed between the second conductive member 416 and the second PCB 416 in the second housing area H2. In an embodiment, the supporting member 430 may be formed of, at least in part, a conductive material (e.g., metal) to reinforce the rigidity of the electronic device 400. That is, the supporting member 430 may include a first conductive portion 431, a non-conductive portion 432 disposed adjacent to the first conductive portion 431, and a second conductive portion 433 formed in the non-conductive portion 432. The second conductive portion 433 may be electrically isolated from the first conductive portion 431 through the non-conductive portion 432 in an island manner, for example. In an embodiment, the supporting member 430 may be formed using an insert injection molding for disposing the non-conductive portion 432 in the first conductive portion 431. In this case, the first conductive portion 431 and the second conductive portion 433 may be formed of the same metal material. The first conductive portion 431 and the second conductive portion 433 may be formed of different metal materials. In an embodiment, the second conductive portion 433 may be used as an electrical connection path between the second conductive member 416 and the second PCB 422. For example, the second conductive member 416 may be electrically connected to the second conductive portion 433 through a conductive tape 435 and also electrically connected to the second PCB 422 through a conductive connector 434. Accordingly, the second conductive member 416 is electrically connected to the ground of the first PCB 421 through the conductive tape 435, the second conductive portion 433 of the supporting member 430, the conductive connector 434, the second PCB 422, the wiring member 440, and the first PCB 421. This provides a ground structure for ground connection equivalent to that of the first conductive member 415, thus preventing and/or reducing a failure in the display 410.

Figure 5:
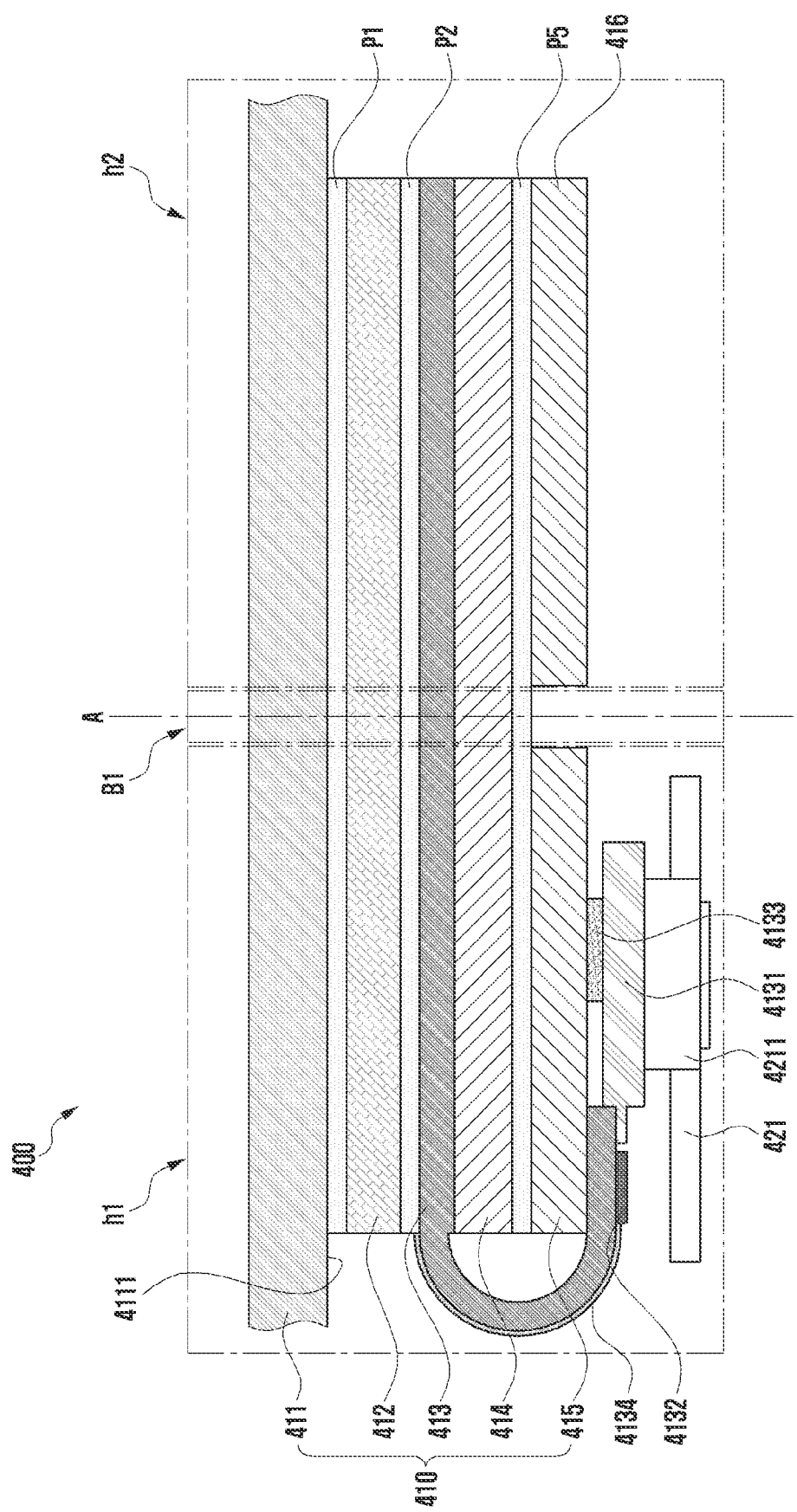
FIGS. 5 and 6 are partial cross-sectional views illustrating an example electronic device according to various embodiments.
Figure 6:
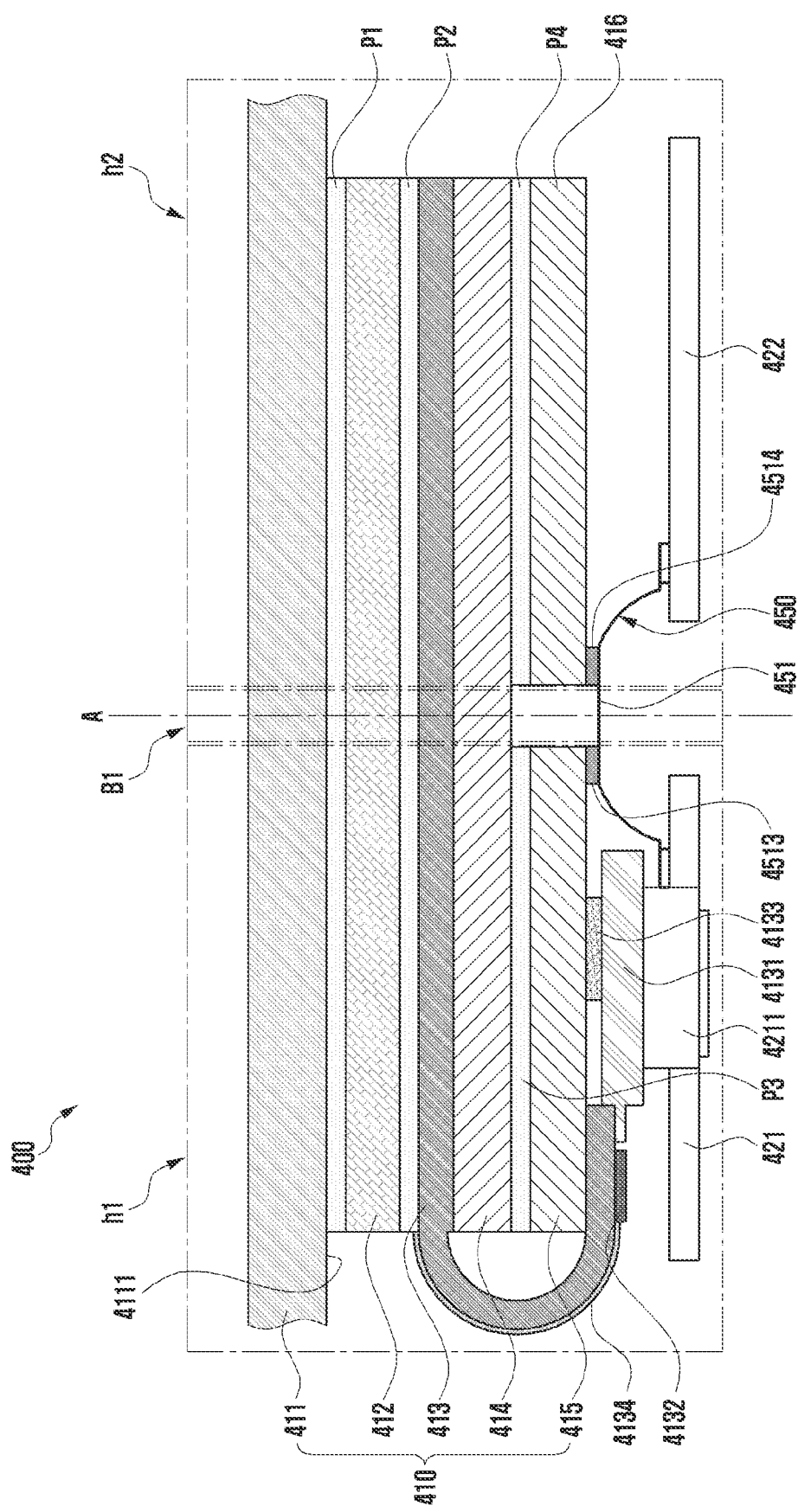

FIGS. 5 and 6 are partial cross-sectional views illustrating an example electronic device 400 according to various embodiments.

In the following description about FIGS. 5 and 6, components that are the substantially same as those of the electronic device 400 shown in FIG. 4 may not be described for convenience.

Referring to FIG. 5, the electronic device 400 may include the display 410 disposed on a rear surface 4111 of the window 411, and the pair of conductive members 415 and 416 disposed under the display 410. In an embodiment, the pair of conductive members 415 and 416 may include the first conductive member 415 disposed in the first housing area H1 and the second conductive member 416 disposed in the second housing area H2. In an embodiment, the first conductive member 415 may have the substantially same configuration as that of FIG. 4 and have a ground connection structure through the first PCB 421.

According to various embodiments, the electronic device 400 may include a conductive adhesive member P5 disposed between the polymer member 414 and the first and second conductive members 415 and 416. In an embodiment, the conductive adhesive member P5 may be formed on a rear surface of the polymer member 414 all over the first housing area H1, the second housing area H2, and the folding area B1. In an embodiment, the first conductive member 415 may be attached to the polymer member 414 through the conductive adhesive member P5 in the first housing area H1, and the second conductive member 416 may be attached to the polymer member 414 through the conductive adhesive member P5 in the second housing area H2. In an embodiment, the conductive adhesive member P5 may include a conductive PSA, a conductive OCA, or a conductive double-sided tape. Being electrically connected to the first conductive member 415 through the conductive adhesive member P5, the second conductive member 416 may provide a ground structure for ground connection equivalent to that of the first conductive member 415.

Referring to FIG. 6, the electronic device 400 may include at least one wiring member 450 (e.g., the wiring member 263 in FIG. 3 or the wiring member 440 in FIG. 4) that connects the first and second PCBs 421 and 422 while passing through the folding area B1. In an embodiment, the wiring member 450 may be used for delivery of electrical signals between the first and second PCBs 421 and 422. In an embodiment, the wiring member 450 may include at least one FPCB.

According to various embodiments, at least a portion of the wiring member 450 may be used as an electrical connection path between the first conductive member 415 and the second conductive member 416. For example, one portion of the wiring member 450 may be attached and electrically connected to the first conductive member 415 through a conductive tape 4513 in the first housing area H1, and another portion of the wiring member 450 may be attached and electrically connected to the second conductive member 416 through another conductive tape 4414 in the second housing area H2. Therefore, as shown and discussed in FIG. 4, the first conductive member 415 may have a ground connection structure through the first PCB 421. In addition, the second conductive member 416 is electrically connected to the ground of the first PCB 415 through the wiring member 450, thereby providing a ground structure for ground connection equivalent to that of the first conductive member 415.

Figure 7:
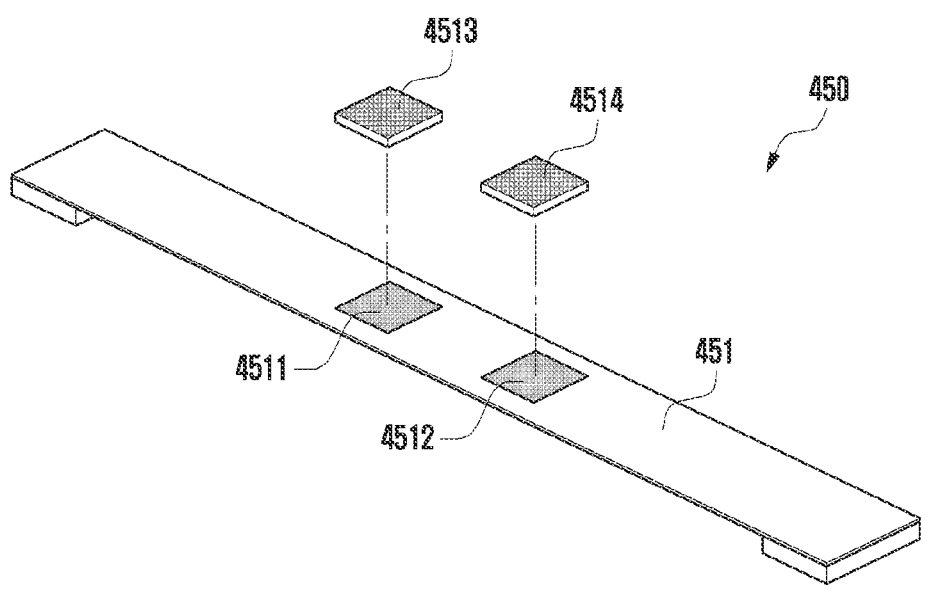
FIG. 7 is a perspective view illustrating the wiring member shown in FIG. 6 according to various embodiments.

FIG. 7 is a perspective view illustrating the wiring member 450 shown in FIG. 6.

Referring to FIG. 7, the wiring member 450 may be connected from a first PCB (e.g., the first PCB 421 in FIG. 6) disposed in a first housing area (e.g., the first housing area H1 in FIG. 6) to a second PCB (e.g., the second PCB 422 in FIG. 6) disposed in a second housing area (e.g., the second housing area H2 in FIG. 6). In an embodiment, the wiring member 450 may include a connecting portion 451 (e.g., substrate) having a suitable length for accepting folded and unfolded operations of a first housing (e.g., the first housing 210 in FIG. 2A) and a second housing (e.g., the second housing 220 in FIG. 2A) with respect to a folding area (e.g., the folding area B1 in FIG. 6).

In an embodiment, the connecting portion 451 may contain a conductive connection pattern having a certain length. The conductive connection pattern in the connecting portion 451 are partly exposed at positions to meet first and second conductive members (e.g., the first and second conductive members 415 and 416 in FIG. 6), thus forming a first exposed part 4511 and a second exposed part 4512. In another embodiment, the conductive connection pattern may be a ground (GND). In an embodiment, the first exposed part 4511 of the wiring member 450 may be attached and electrically connected to the rear surface of the first conductive member 415 through a conductive tape 4513, and the second exposed part 4512 may be attached and electrically connected to the rear surface of the second conductive member 416 through another conductive tape 4514. In another embodiment, the first and second exposed parts 4511 and 4512 may be fixedly attached and electrically connected to the first and second conductive members 415 and 416 through soldering instead of the conductive tapes 4513 and 4514.

FIG. 8 is a partial cross-sectional view of an electronic device 400 according to various embodiments.

In the following description about FIG. 8, components that are the substantially same as those of the electronic device 400 shown in FIG. 4 may not be described for convenience.

Referring to FIG. 8, the electronic device 400 may include a touch panel 417 disposed between the polarizer 412 and the display panel 413. In an embodiment, the polarizer 412, the touch panel 417, the display panel 413, the polymer member 414, and the pair of conductive members 415 and 416, which are sequentially disposed on the rear surface 4111 of the window 411, may be attached to each other via adhesive members P1, P2, P3, P4, and P6. For example, the adhesive members P1, P2, P3, P4, and P6 may include an optical clear adhesive (OCA), a pressure sensitive adhesive (PSA), a thermally reactive adhesive, a normal adhesive, or a double-sided adhesive tape.

According to various embodiments, the first conductive member 415 has the substantially same configuration as that of FIG. 4, and may have a ground structure that is electrically connected to the ground of the first PCB 421 disposed on the rear surface of the first supporting member 431 (e.g., the first supporting member 261 in FIG. 3).

According to various embodiments, the display 410 may include a bendable portion 4174 that is extended from the touch panel 417 and then bent toward and disposed on the rear surface of the second conductive member 416. In addition, the display 410 may include a second FPCB 4171 electrically connected to the bendable portion 4174. In an embodiment, the second FPCB 4171 may have a conductive region that is exposed, at least in part, and then attached and electrically connected to the second conductive member 416 through a conductive tape 4173. In an embodiment, a control circuit 4172 may be mounted on the bendable portion 4174 of the touch panel 417. In an embodiment, the control circuit 4172 may include a touch driver IC (TDI). In an embodiment, the TDI may have a chip on panel (COP) structure disposed on the bendable portion 4174.

In an embodiment, the touch panel 417 may be electrically connected to the second PCB 422 through a second electrical connection member 4221 connected from the second FPCB 4171 to the second PCB 422 disposed on the rear surface of the second supporting member 430 (e.g., the second supporting member 262 in FIG. 3 or the supporting member 430 in FIG. 4). For example, the second electrical connection member 4221 may be an FPCB containing a connector therein. In another embodiment, the second FPCB 4171 may be directly connected to the second PCB 422 through a separate conductive connector. In an embodiment, the second electrical connection member 4221 may be used for delivery of a control signal between the second PCB 422 and the touch panel 417 and may include a ground wiring path. Accordingly, the second conductive member 416 may have a ground structure that is electrically connected to the ground of the first PCB 421 through the conductive tape 4173, the second FPCB 4171 connected to the touch panel 417, the second electrical connection member 4221, the second PCB 422, and a wiring member (e.g., the wiring member 440 in FIG. 4).

As described hereinbefore, the second housing has the ground structure that is equivalent to that of the first housing. This is advantageous to realizing a stable ground connection structure and thus improving the quality of the electronic device.

According to various example embodiments, an electronic device (e.g., the electronic device 200 in FIG. 2A) may include a housing that includes a hinge (e.g., the hinge 264 in FIG. 3), a first housing (e.g., the first housing 210 in FIG. 2A) connected to the hinge and including a first surface (e.g., the first surface 211 in FIG. 2A) facing a first direction, a second surface (e.g., the second surface 212 in FIG. 2A) facing a second direction opposite the first direction, and a first lateral member (e.g., the first lateral member 213 in FIG. 2A) at least partially surrounding a first space between the first surface and the second surface, and a second housing (e.g., the second housing 220 in FIG. 2A) connected to the hinge and including a third surface (e.g., the third surface 221 in FIG. 2A) facing a third direction, a fourth surface (e.g., the fourth surface 222 in FIG. 2A) facing a fourth direction opposite the third direction, and a second lateral member (e.g., the second lateral member 223 in FIG. 2A) at least partially surrounding a second space between the third surface and the fourth surface. The first and second housings are rotatably coupled with each other through the hinge to allow the electronic device to be in a folded state or an unfolded state. The first surface faces the third surface in the folded state, and the first and third directions are substantially equal to each other in the unfolded state. The electronic device may further include a first printed circuit board (PCB) (e.g., the first PCB 421 in FIG. 4) disposed in the first space, a second PCB (e.g., the second PCB 422 in FIG. 4) disposed in the second space, at least one wiring member (e.g., the wiring member 440 in FIG. 4) electrically connecting the first and second PCBs, and a window (e.g., the window 411 in FIG. 4) disposed over the first surface, the hinge, and the third surface. The electronic device may further include a display (e.g., the display 410 in FIG. 4) disposed on a rear surface of the window and including a display panel (e.g., the display panel 413 in FIG. 4) at least partially extending to the first space, having a first flexible PCB (FPCB) (e.g., the first FPCB 4131 in FIG. 4) electrically connected to a ground of the first PCB, and disposed to be viewable through the window, a polymer member (e.g., the polymer member 414 in FIG. 4) disposed on a rear surface of the display panel, a first conductive member (the first conductive member 415 in FIG. 4) disposed on a rear surface of the polymer member in the first space and electrically connected to the first FPCB, and a second conductive member (e.g., the second conductive member 416 in FIG. 4) disposed on the rear surface of the polymer member in the second space. The electronic device may further include a supporting member (e.g., the supporting member 430 in FIG. 4) disposed between the second conductive member and the second PCB in the second space and including, at least in part, a conductive region (e.g., the second conductive portion 433 in FIG. 4). The second conductive member is electrically connected to the second PCB through the conductive region and electrically connected to the ground of the first PCB through the wiring member.

According to various example embodiments, the supporting member may include a first conductive portion (e.g., the first conductive portion 431 in FIG. 4), a non-conductive portion (e.g., the non-conductive portion 432 in FIG. 4) disposed adjacent to the first conductive portion, and a second conductive portion (e.g., the second conductive portion 433 in FIG. 4) disposed in the non-conductive portion and electrically isolated from the first conductive portion.

According to various example embodiments, the supporting member may be formed using an insert injection molding for disposing the non-conductive portion in the first conductive portion, and the first and second conductive portions may be formed of same metal material.

According to various example embodiments, the conductive portion may be fixedly attached and electrically connected to the second conductive member using a conductive tape (e.g., the conductive tape 435 in FIG. 4).

According to various example embodiments, the conductive portion may be electrically connected to the second PCB through a conductive connector (e.g., the conductive connector 434 in FIG. 4).

According to various example embodiments, the first FPCB may include a conductive region exposed at least in part, and the conductive region may be attached and electrically connected to the first conductive member through a conductive tape (e.g., the conductive tape 4133 in FIG. 4).

According to various example embodiments, the display panel may include a bendable portion (e.g., the bendable portion 4134 in FIG. 4) extending and bent toward the first conductive member, and a control circuit (e.g., the control circuit 4132 in FIG. 4) mounted on the bendable portion.

According to various example embodiments, the control circuit may include a display driver IC (DDI) or a touch display driver IC (TDDI).

According to various example embodiments, a polarizer (e.g., the polarizer 412 in FIG. 4) may be interposed between the display panel and the window.

According to various example embodiments, at least one of the first and second conductive members may include copper (Cu), aluminum (Al), stainless steel, or a clad metal which is a stack of different kinds of metals.

According to various example embodiments, the electronic device may further include at least one functional member disposed between the polymer member and at least one of the first and second conductive members.

According to various example embodiments, the functional member may include at least one of a graphite sheet, an added display, a force touch FPCB, a fingerprint sensor FPCB, a communication antenna radiator, a heat dissipation sheet, a conductive/nonconductive tape, or an open cell sponge.

According to various example embodiments, the window, the display panel, the polymer member, the first conductive member, and the second conductive member may be attached to each other through an adhesive member (e.g., the adhesive members P1, P2, P3, and P4 in FIG. 4) including at least one of an optical clear adhesive (OCA), a pressure sensitive adhesive (PSA), a thermally reactive adhesive, a normal adhesive, or a double-sided adhesive tape.

According to various example embodiments, an electronic device (e.g., the electronic device 200 in FIG. 2A) may include a housing that includes a hinge (e.g., the hinge 264 in FIG. 3), a first housing (e.g., the first housing 210 in FIG. 2A) connected to the hinge and including a first surface (e.g., the first surface 211 in FIG. 2A) facing a first direction, a second surface (e.g., the second surface 212 in FIG. 2A) facing a second direction opposite to the first direction, and a first lateral member (e.g., the first lateral member 213 in FIG. 2A) at least partially surrounding a first space between the first surface and the second surface, and a second housing (e.g., the second housing 220 in FIG. 2A) connected to the hinge and including a third surface (e.g., the third surface 221 in FIG. 2A) facing a third direction, a fourth surface (e.g., the fourth surface 222 in FIG. 2A) facing a fourth direction opposite the third direction, and a second lateral member (e.g., the second lateral member 223 in FIG. 2A) at least partially surrounding a second space between the third surface and the fourth surface. The first and second housings are rotatably coupled with each other through the hinge to allow the electronic device to be in a folded state or an unfolded state. The first surface faces the third surface in the folded state, and the first and third directions are substantially equal to each other in the unfolded state. The electronic device may further include a first printed circuit board (PCB) (e.g., the first PCB 421 in FIG. 5) disposed in the first space, and a window (e.g., the window 411 in FIG. 5) disposed over the first surface, the hinge, and the third surface. The electronic device may further include a display (e.g., the display 410 in FIG. 5) disposed on a rear surface of the window and including a display panel (e.g., the display panel 413 in FIG. 5) at least partially extending to the first space, having a first flexible PCB (FPCB) (e.g., the first FPCB 4131 in FIG. 5) electrically connected to a ground of the first PCB, and disposed to be viewable through the window, a polymer member (e.g., the polymer member 414 in FIG. 5) disposed on a rear surface of the display panel, a first conductive member (the first conductive member 415 in FIG. 5) disposed on a rear surface of the polymer member in the first space and electrically connected to the first FPCB, and a second conductive member (e.g., the second conductive member 416 in FIG. 5) disposed on the rear surface of the polymer member in the second space. The electronic device may further include a conductive adhesive member (e.g., the conductive adhesive member P5 in FIG. 5) disposed between the polymer member and each of the first and second conductive members. The second conductive member is electrically connected to the ground of the first PCB through the conductive adhesive member.

According to various example embodiments, the conductive adhesive member may include a conductive PSA, a conductive OCA, or a conductive double-sided tape.

According to various example embodiments, an electronic device (e.g., the electronic device 200 in FIG. 2A) may include a housing that includes a hinge (e.g., the hinge 264 in FIG. 3), a first housing (e.g., the first housing 210 in FIG. 2A) connected to the hinge and including a first surface (e.g., the first surface 211 in FIG. 2A) facing a first direction, a second surface (e.g., the second surface 212 in FIG. 2A) facing a second direction opposite the first direction, and a first lateral member (e.g., the first lateral member 213 in FIG. 2A) at least partially surrounding a first space between the first surface and the second surface, and a second housing (e.g., the second housing 220 in FIG. 2A) connected to the hinge and including a third surface (e.g., the third surface 221 in FIG. 2A) facing a third direction, a fourth surface (e.g., the fourth surface 222 in FIG. 2A) facing a fourth direction opposite the third direction, and a second lateral member (e.g., the second lateral member 223 in FIG. 2A) at least partially surrounding a second space between the third surface and the fourth surface. The first and second housings are rotatably coupled with each other through the hinge to allow the electronic device to be in a folded state or an unfolded state. The first surface faces the third surface in the folded state, and the first and third directions are substantially equal to each other in the unfolded state. The electronic device may further include a first printed circuit board (PCB) (e.g., the first PCB 421 in FIG. 6) disposed in the first space, a second PCB (e.g., the second PCB 422 in FIG. 6) disposed in the second space, at least one wiring member (e.g., the wiring member 450 in FIG. 6) electrically connecting the first and second PCBs, and a window (e.g., the window 411 in FIG. 6) disposed over the first surface, the hinge, and the third surface. The electronic device may further include a display (e.g., the display 410 in FIG. 6) disposed on a rear surface of the window and including a display panel (e.g., the display panel 413 in FIG. 6) at least partially extending to the first space, having a first flexible PCB (FPCB) (e.g., the first FPCB 4131 in FIG. 6) electrically connected to a ground of the first PCB, and disposed to be viewable through the window, a polymer member (e.g., the polymer member 414 in FIG. 6) disposed on a rear surface of the display panel, a first conductive member (the first conductive member 415 in FIG. 6) disposed on a rear surface of the polymer member in the first space and electrically connected to the first FPCB, and a second conductive (e.g., the second conductive member 416 in FIG. 6) disposed on the rear surface of the polymer member in the second space. The second conductive member is electrically connected to the first conductive member through at least a portion of the wiring member.

According to various example embodiments, the wiring member may include a first exposed part (e.g., the first exposed part 4511 in FIG. 7) exposed in the first space and electrically connected to the first conductive member, and a second exposed part (e.g., the second exposed part 4512 in FIG. 7) exposed in the second space and electrically connected to the second conductive member. The first and second exposed parts may be attached and electrically connected to the first and second conductive members, respectively, through a conductive tape (e.g., the conductive tapes 4513 and 4514 in FIG. 7).

According to various example embodiments, the wiring member may include an FPCB.

According to various example embodiments, an electronic device (e.g., the electronic device 200 in FIG. 2A) may include a housing that includes a hinge (e.g., the hinge 264 in FIG. 3), a first housing (e.g., the first housing 210 in FIG. 2A) connected to the hinge and including a first surface (e.g., the first surface 211 in FIG. 2A) facing a first direction, a second surface (e.g., the second surface 212 in FIG. 2A) facing a second direction opposite the first direction, and a first lateral member (e.g., the first lateral member 213 in FIG. 2A) at least partially surrounding a first space between the first surface and the second surface, and a second housing (e.g., the second housing 220 in FIG. 2A) connected to the hinge and including a third surface (e.g., the third surface 221 in FIG. 2A) facing a third direction, a fourth surface (e.g., the fourth surface 222 in FIG. 2A) facing a fourth direction opposite the third direction, and a second lateral member (e.g., the second lateral member 223 in FIG. 2A) at least partially surrounding a second space between the third surface and the fourth surface. The first and second housings are rotatably coupled with each other through the hinge to allow the electronic device to be in a folded state or an unfolded state. The first surface faces the third surface in the folded state, and the first and third directions are substantially equal to each other in the unfolded state. The electronic device may further include a first printed circuit board (PCB) (e.g., the first PCB 421 in FIG. 8) disposed in the first space, a second PCB (e.g., the second PCB 422 in FIG. 8) disposed in the second space, at least one wiring member (e.g., the wiring member 440 in FIG. 4) electrically connecting the first and second PCBs, and a window (e.g., the window 411 in FIG. 8) disposed over the first surface, the hinge, and the third surface. The electronic device may further include a display (e.g., the display 410 in FIG. 8) disposed on a rear surface of the window and including a display panel (e.g., the display panel 413 in FIG. 8) at least partially extending to the first space, having a first flexible PCB (FPCB) (e.g., the first FPCB 4131 in FIG. 8) electrically connected to a ground of the first PCB, and disposed to be viewable through the window, a touch panel (e.g., the touch panel 417 in FIG. 8) disposed between the window and the display panel, at least partially extending to the second space, and having a second FPCB (e.g., the second FPCB 4171 in FIG. 8) electrically connected to the second PCB, a polymer member (e.g., the polymer member 414 in FIG. 8) disposed on a rear surface of the display panel, a first conductive member (the first conductive member 415 in FIG. 8) disposed on a rear surface of the polymer member in the first space and electrically connected to the first FPCB, and a second conductive member (e.g., the second conductive member 416 in FIG. 8) disposed on the rear surface of the polymer member in the second space and electrically connected to the second FPCB. The second conductive member is electrically connected to the ground of the first PCB through the second PCB and the wiring member.

According to various example embodiments, the touch panel may include a bendable portion (e.g., the bendable portion 4174 in FIG. 8) extending and bent toward the second conductive member, and a control circuit (e.g., the control circuit 4172 in FIG. 8) mounted on the bendable portion, and the control circuit may include a touch driver IC (TDI).

While the disclosure has been illustrated and described with reference to various example embodiments thereof, it will be understood by those skilled in the art that various changes in form and details may be made therein without departing from the true scope and full scope of the disclosure.

What is claimed is:

1. A portable communication device comprising:
   a foldable housing including a first housing portion and a second housing portion;
   a transparent member;
   a flexible display panel visible via the transparent member, and including a first display portion accommodated in the first housing portion and a second display portion accommodated in the second housing portion, the first display portion accommodated in the first housing such that a first part of the first display portion is disposed under and parallel with the transparent member, that a second part of the first display portion is disposed as parallel with the first part, and that a third part is extended as bended between the first part and the second part;
   at least one conductive plate including a first conductive portion and a second conductive portion, the first conductive portion accommodated in the first housing portion under the first part such that at least part of the first conductive portion is disposed between the first part and the second part, and the second conductive portion accommodated in the second housing portion under the second display portion;
a first printed circuit board (PCB) accommodated in the first housing portion and in contact with the second part, the first PCB electrically connected with the first conductive portion;
a second PCB accommodated in the second housing portion under the second conductive portion, the second PCB electrically connected with the second conductive portion;
a third PCB accommodated in the first housing portion and including a ground member; and
a flexible printed circuit board (FPCB) electrically connecting the second PCB and the third PCB,
wherein the first conductive portion is electrically connected with the ground member via the first PCB, and the second conductive portion is electrically connected with the ground member of the third PCB via the second PCB and the FPCB.

2. The portable communication device of claim 1, further comprising:
a fourth PCB accommodated in the first housing portion and electrically connected with the first PCB and the third PCB.

3. The portable communication device of claim 2, wherein the first PCB or the fourth PCB is more flexible than the second PCB or the third PCB (421).

4. The portable communication device of claim 1, wherein the first PCB is electrically connected with the first conductive portion via a conductive tape attached therewith.

5. The portable communication device of claim 1, further comprising:
a supporting member disposed between the second conductive portion and the second PCB, the supporting member including a conductive portion and a non-conductive portion surrounding the conductive portion; and
wherein the second PCB is electrically connected with the second conductive portion via the conductive portion of the supporting member.

6. The portable communication device of claim 5, wherein the second conductive portion is electrically connected with the conductive portion of the supporting member via a conductive tape attached therewith.

7. The portable communication device of claim 1, further comprising:
a display driver integrated circuit disposed on the second part.

* * * * *